US011468220B2

(12) United States Patent
Zhu et al.

(10) Patent No.: US 11,468,220 B2
(45) Date of Patent: Oct. 11, 2022

(54) METHOD AND SYSTEM FOR ENHANCING PROGRAMMABILITY OF A FIELD-PROGRAMMABLE GATE ARRAY VIA A DUAL-MODE PORT

(71) Applicant: GOWIN Semiconductor Corporation, GuangZhou (CN)

(72) Inventors: Jinghui Zhu, San Jose, CA (US); Diwakar Chopperla, Fremont, CA (US)

(73) Assignee: GOWIN SEMICONDUCTOR CORPORATION, Guangzhou (CN)

( * ) Notice: Subject to any disclaimer, the term of this patent is extended or adjusted under 35 U.S.C. 154(b) by 0 days.

(21) Appl. No.: 16/938,798

(22) Filed: Jul. 24, 2020

(65) Prior Publication Data

US 2022/0027543 A1    Jan. 27, 2022

(51) Int. Cl.
*G06F 30/347*   (2020.01)
(52) U.S. Cl.
CPC .................. *G06F 30/347* (2020.01)
(58) Field of Classification Search
CPC ........ G06F 21/76; G06F 21/44; G06F 30/331; G06F 15/177; G06F 30/347; G06F 30/39; H03K 19/17728
See application file for complete search history.

(56) References Cited

U.S. PATENT DOCUMENTS

| | | | | |
|---|---|---|---|---|
| 5,553,056 A * | 9/1996 | Bronte | .................. | H04J 3/0608 370/253 |
| 6,018,490 A * | 1/2000 | Cliff | .................. | G11C 8/12 365/189.02 |
| 6,044,025 A * | 3/2000 | Lawman | .................. | G06F 30/34 365/191 |
| 6,198,304 B1 * | 3/2001 | Sasaki | .............. | H03K 19/17728 326/39 |
| 6,828,823 B1 * | 12/2004 | Tsui | .................. | H03K 19/17752 326/40 |
| 7,019,558 B1 * | 3/2006 | Jacobson | ................ | G06F 30/34 326/38 |
| 7,102,386 B2 * | 9/2006 | Leijten-Nowak | ........ | G11C 8/16 326/37 |

(Continued)

OTHER PUBLICATIONS

Ho et al.; "Logical-to-Physical Memory Mapping for FPGAs with Dual-Port Embedded Arrays"; Proc. of the Int'l Workshop of Field Programmable Logic and Applications, pp. 111-123 (Year: 1999).*

(Continued)

*Primary Examiner* — Helen Rossoshek
(74) *Attorney, Agent, or Firm* — JW Law Group; James M. Wu

(57) ABSTRACT

A programmable semiconductor system includes a programmable integrated circuit ("PIC") and storage capable of facilitating a multi-boot with backup default configuration ("MBC") process. The PIC, in one embodiment, includes a dual-mode port ("DMP"), configurable logic blocks ("LBs"), routing connections, and a configuration memory for providing configuration data to facilitate user-defined logic functions. The DMP, in one aspect, is operable to handle the configuration data during a configuration mode. Alternatively, the DMP is operable to handle the user data during a logic operation mode. In one aspect, the user configuration data contains the address of the second memory containing DCD.

25 Claims, 16 Drawing Sheets

(56) References Cited

U.S. PATENT DOCUMENTS

| | | | | |
|---|---|---|---|---|
| 7,133,822 | B1* | 11/2006 | Jacobson | G06F 11/2294 703/28 |
| 7,215,139 | B2* | 5/2007 | Agrawal | H03K 19/1776 326/38 |
| 7,242,218 | B2* | 7/2007 | Camarota | H03K 19/17768 326/41 |
| 7,248,073 | B2* | 7/2007 | New | H03K 19/17728 326/39 |
| 7,759,968 | B1* | 7/2010 | Hussein | H03K 19/17764 326/38 |
| 7,768,300 | B1* | 8/2010 | Tang | H03K 19/17758 365/189.08 |
| 7,859,292 | B1* | 12/2010 | Shuler, Jr. | H03K 19/0075 326/11 |
| 7,890,917 | B1* | 2/2011 | Young | G06F 30/34 716/117 |
| 8,060,784 | B1 | 11/2011 | Spinti et al. | |
| 8,065,574 | B1* | 11/2011 | Cheng | H03K 19/17764 714/725 |
| 8,069,329 | B1 | 11/2011 | Tang et al. | |
| 8,117,580 | B1* | 2/2012 | Trimberger | G06F 30/34 716/116 |
| 8,384,427 | B1* | 2/2013 | Tang | H03K 19/1776 326/39 |
| 8,879,427 | B2* | 11/2014 | Krumel | H04L 29/06 370/255 |
| 9,244,857 | B2* | 1/2016 | Steele, Jr. | G06F 12/1018 |
| 9,479,275 | B2* | 10/2016 | Poulsen | H04L 12/40117 |
| 9,852,247 | B2* | 12/2017 | Yao | G06F 30/34 |
| 10,079,054 | B1* | 9/2018 | Gunaratna | G11C 8/14 |
| 10,116,557 | B2* | 10/2018 | Gray | H04L 45/60 |
| 10,191,661 | B1* | 1/2019 | Ng | G06F 3/0659 |
| 2002/0196809 | A1* | 12/2002 | Agrawal | H03K 19/1737 370/469 |
| 2008/0024165 | A1* | 1/2008 | Madurawe | H03K 19/1778 326/41 |
| 2009/0024746 | A1* | 1/2009 | Welch | H04L 12/4625 709/228 |
| 2010/0188117 | A1* | 7/2010 | Street | H03K 19/1733 326/38 |
| 2011/0215829 | A1* | 9/2011 | Guajardo Merchan | H01L 23/544 326/8 |
| 2012/0280711 | A1* | 11/2012 | Landry | H03K 19/1776 326/41 |
| 2016/0321081 | A1* | 11/2016 | Kim | G06F 9/441 |
| 2017/0315813 | A1* | 11/2017 | Smith | G06F 9/3897 |
| 2018/0095670 | A1* | 4/2018 | Davis | G06F 3/0685 |
| 2018/0329858 | A1* | 11/2018 | Zhu | G06F 13/4282 |
| 2020/0127666 | A1* | 4/2020 | Wang | G01R 31/318519 |
| 2020/0401094 | A1* | 12/2020 | Zhu | G05B 19/0426 |

OTHER PUBLICATIONS

Lai et al.; "The Architecture of FDP FPGA Device"; 2008 4th Southern Conference on Programmable Logic; Conference Paper | Publisher: IEEE (Year: 2008).*

Mrs.Bhagyalakshmi et al. "Design and implementation of DA-Based Reconfigurable FIR Digital Filter on FPGA", 2015 International Conference on Emerging Research in Electronics, Computer Science and Technology (ICERECT); Conference Paper | Publisher: IEEE (Year: 2015).*

Han et al.; "Design and Verification of Distributed RAM Using Look-Up Tables in an SOI-Based FPGA"; 2010 10th IEEE International Conference on Solid-State and Integrated Circuit Technology; Conference Paper | Publisher: IEEE (Year: 2010).*

* cited by examiner

METHOD AND SYSTEM FOR ENHANCING PROGRAMMABILITY OF A FIELD-PROGRAMMABLE GATE ARRAY VIA A DUAL-MODE PORT

RELATED APPLICATION

This application is related to the following co-pending application assigned to the Assignee of the present invention.

a. application Ser. No. 16/938,771, filed Jul. 24, 2020, entitled "Method and System for Enhancing Programmability of a Field-Programmable Gate Array," invented by the same inventors.

FIELD

The exemplary embodiment(s) of the present application relates to the field of programmable semiconductor devices for logic operations involving in the computer hardware and software. More specifically, the exemplary embodiment(s) of the present invention relates to enhancing the integrity of a field-programmable gate array ("FPGA") or programmable logic device ("PLD") during a process of configuration.

BACKGROUND

With increasing popularity of digital communication, artificial intelligence (AI), IoT (Internet of Things), and/or robotic controls, the demand for faster, flexible, and efficient hardware and/or semiconductors with processing capabilities is constantly in demand. To meet such demand, high-speed and flexible semiconductor chips are generally more desirable. One conventional approach to satisfy such demand is to use dedicated custom integrated circuits and/or application-specific integrated circuits ("ASICs"). A shortcoming with the ASIC approach is that it lacks flexibility while consumes a large number of resources.

An alternative approach, which enjoys the growing popularity, is utilizing programmable semiconductor devices ("PSDs") such as programmable logic devices ("PLDs") or field-programmable gate arrays ("FPGAs"). A feature of PSD is that it allows an end-user to program and/or reprogram one or more desirable functions to suit his/her applications after the PSD is fabricated.

A drawback, however, associated with a conventional FPGA or PLD is that it is typically vulnerable in dealing with defective and/or corrupted configuration data.

SUMMARY

One embodiment of the present application discloses a programmable semiconductor system ("PSS") capable of improving the programmability and/or integrity of a PSD, also known as a programmable integrated circuit ("PIC"), via a multi-boot with backup default configuration ("MBC") operation. PIC, in one aspect, includes configurable logic blocks ("LBs"), routing connections, and configuration memory for performing user-defined logic functions. Each LB, in one example, includes one or more lookup tables ("LUTs") configured to provide one or more output signals in accordance with a set of input signals and the configuration data stored in the configuration memory.

PSS includes PIC and a storage device wherein the storage device further includes a first memory and second memory. While the first memory stores a user-defined configuration data for programming or booting PIC, the second memory stores a backup default page ("BDP") or backup default image ("BDI"). In one aspect, BDP contains manufacture provided default configuration data ("DCD") for programming or booting PIC when the user-defined configuration data fails to boot PIC. In an alternative embodiment, the user-defined configuration data contains a memory address pointing to the second memory which contains an alternative configuration data such as DCD.

PSS, in one embodiment, further includes a dual-mode port ("DMP") for providing a dual purpose of information transmission. The DMP, in one aspect, is operable to handle the configuration data during a configuration mode. Alternatively, the DMP is operable to handle the user data during a logic operation mode.

Additional features and benefits of the exemplary embodiment(s) of the present invention will become apparent from the detailed description, figures, and claims set forth below.

BRIEF DESCRIPTION OF THE DRAWINGS

The exemplary embodiment(s) of the present invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Figure 1A:
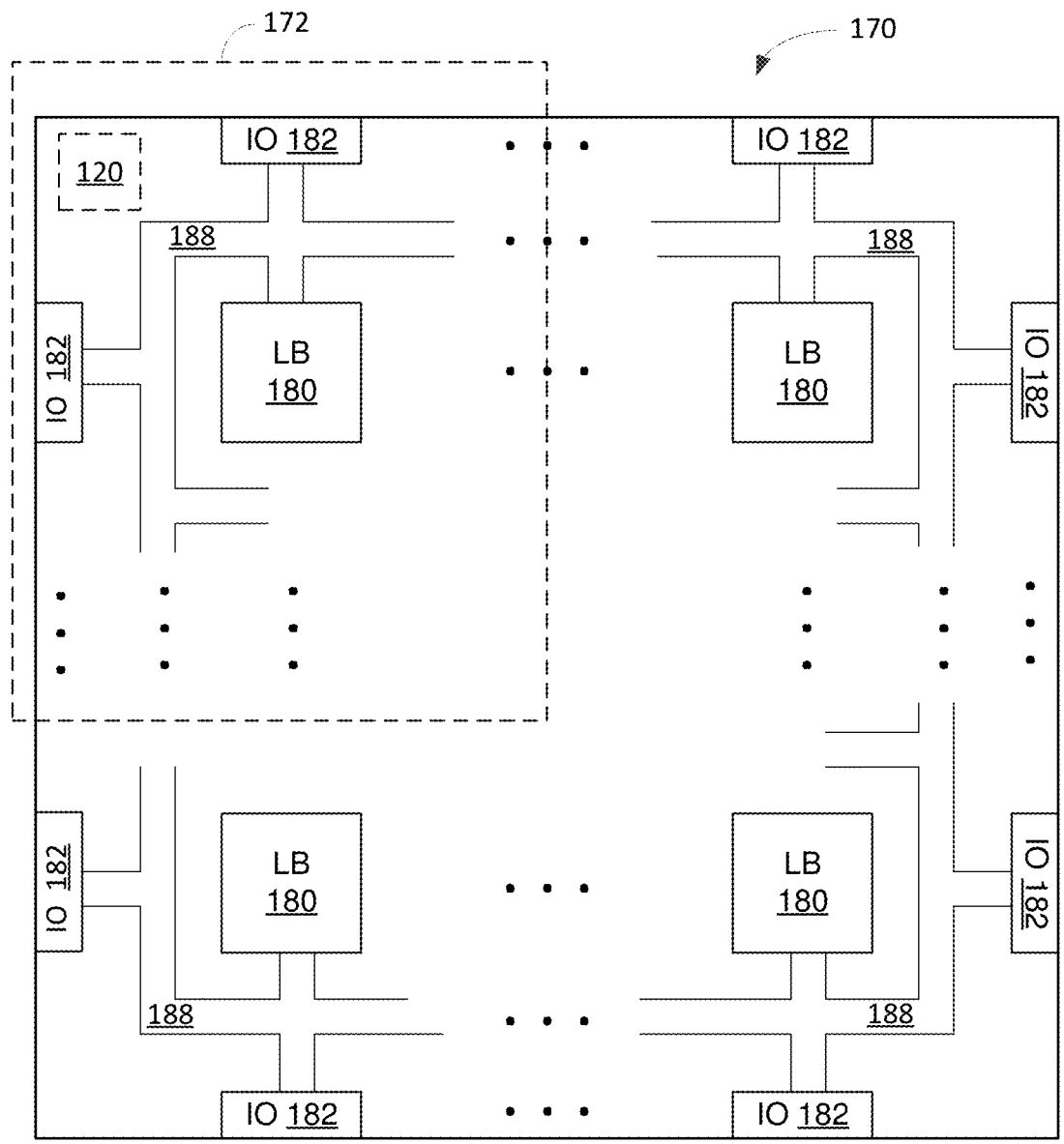
FIGS. 1A-1B are block diagrams illustrating a programmable semiconductor device ("PSD") capable of enhancing its integrity and/or reliability using an MBC process in accordance with one embodiment of the present invention.

Embodiments of the present invention disclose a method(s) and/or apparatus for providing a programmable semiconductor device ("PSD") or programmable integrated circuit ("PIC") configured to enhance reliability via operation of multi-boot with backup default configuration data.

The purpose of the following detailed description is to provide an understanding of one or more embodiments of the present invention. Those of ordinary skills in the art will realize that the following detailed description is illustrative only and is not intended to be in any way limiting. Other embodiments will readily suggest themselves to such skilled persons having the benefit of this disclosure and/or description.

In the interest of clarity, not all of the routine features of the implementations described herein are shown and described. It will, of course, be understood that in the development of any such actual implementation, numerous implementation-specific decisions may be made in order to achieve the developer's specific goals, such as compliance with application- and business-related constraints, and that these specific goals will vary from one implementation to another and from one developer to another. Moreover, it will be understood that such a development effort might be complex and time-consuming but would nevertheless be a routine undertaking of engineering for those of ordinary skills in the art having the benefit of embodiment(s) of this disclosure.

Various embodiments of the present invention illustrated in the drawings may not be drawn to scale. Rather, the dimensions of the various features may be expanded or reduced for clarity. In addition, some of the drawings may be simplified for clarity. Thus, the drawings may not depict all of the components of a given apparatus (e.g., device) or method. The same reference indicators will be used throughout the drawings and the following detailed description to refer to the same or like parts.

In accordance with the embodiment(s) of the present invention, the components, process steps, and/or data structures described herein may be implemented using various types of operating systems, computing platforms, computer programs, and/or general-purpose machines. In addition, those of ordinary skills in the art will recognize that devices of a less general-purpose nature, such as hardware devices, field-programmable gate arrays (FPGAs), application-specific integrated circuits (ASICs), or the like, may also be used without departing from the scope and spirit of the inventive concepts disclosed herein. Where a method comprising a series of process steps is implemented by a computer or a machine and those process steps can be stored as a series of instructions readable by the machine, they may be stored on a tangible medium such as a computer memory device, such as but not limited to, magnetoresistive random access memory ("MRAM"), phase-change memory, or ferroelectric RAM ("FeRAM"), flash memory, ROM (Read Only Memory), PROM (Programmable Read-Only Memory), EEPROM (Electrically Erasable Programmable Read-Only Memory), Jump Drive, magnetic storage medium (e.g., tape, magnetic disk drive, and the like), optical storage medium (e.g., CD-ROM, DVD-ROM, paper card and paper tape, and the like) and other known types of program memory.

The term "system" or "device" is used generically herein to describe any number of components, elements, subsystems, devices, packet switch elements, packet switches, access switches, routers, networks, computer and/or communication devices or mechanisms, or combinations of components thereof. The term "computer" includes a processor, memory, and buses capable of executing instruction wherein the computer refers to one or a cluster of computers, personal computers, workstations, mainframes, or combinations of computers thereof.

A programmable semiconductor system ("PSS"), in one embodiment, is configured to improve the programmability and/or integrity of a PSD or PIC via a multi-boot with backup default configuration ("MBC") operation. PIC, in one aspect, includes configurable LBs, routing connections, and configuration memory for performing user-defined logic functions. Each LB, in one example, includes LUTs configured to provide one or more output signals in accordance with a set of input signals and the configuration data stored in the configuration memory. PSS includes PIC and a storage device wherein the storage device further includes a first memory and second memory. While the first memory stores a user-defined configuration data for programming or booting PIC, the second memory stores a backup default page ("BDP") or backup default image ("BDI"). In one aspect, BDP contains manufacture provided default configuration data ("DCD") for programming or booting PIC when the user-defined configuration data fails to boot PIC. In an alternative embodiment, the user-defined configuration data contains a memory address pointing to the second memory which contains an alternative configuration data such as DCD.

FIG. 1A is a block diagram illustrating a PSD capable of enhancing its integrity and/or reliability using an MBC process in accordance with one embodiment of the present invention. PSD, also known as FPGA, PIC, and/or a type of Programmable Logic Device ("PLD"), includes an MBC module 120 capable of facilitating the MBC process. A function of MBC is to improve the reliability of PIC via multiple rebooting or configuring processes. It should be noted that the underlying concept of the exemplary embodiment(s) of the present invention would not change if one or more blocks (circuit or elements) were added to or removed from diagram 170.

PSD includes an array of configurable LBs 180 surrounded by input/output blocks ("IOs") 182, and programmable interconnect resources 188 ("PIR") that include vertical interconnections and horizontal interconnections extending between the rows and columns of LB 180 and IO 182. PRI 188 may further include interconnecting array decoders ("IAD") or programmable interconnection array ("PIA"). It should be noted that the terms PRI, IAD, and PIA may be used interchangeably hereinafter.

Each LB, in one example, includes programmable combinational circuitry and selectable output registers programmed to implement at least a portion of a user's logic function. The programmable interconnections, connections, or channels of interconnect resources are configured using various switches to generate signal paths between the LBs 180 for performing logic functions. Each IO 182 is programmable to selectively use an I/O pin (not shown) of PSD.

PIC, in one embodiment, can be divided into multiple programmable partitioned regions ("PPRs") 172 wherein each PPR 172 includes a portion of LBs 180, some PPRs 188, and IOs 182. A benefit of organizing PIC into multiple PPRs 172 is to optimize management of storage capacity, power supply, and/or network transmission.

Bitstream is a binary sequence (or a file) containing programming information or data for a PIC, FPGA, or PLD. The bitstream is created to reflect the user's logic functions together with certain controlling information. For an FPGA or PLD to function properly, at least a portion of the registers or flipflops in FPGA needs to be programmed or configured before it can function. It should be noted that bitstream is used as input configuration data to FPGA.

A benefit of using an MBC process is to enhance the reliability of PIC or FPGA during a configuration process.

Figure 1B:
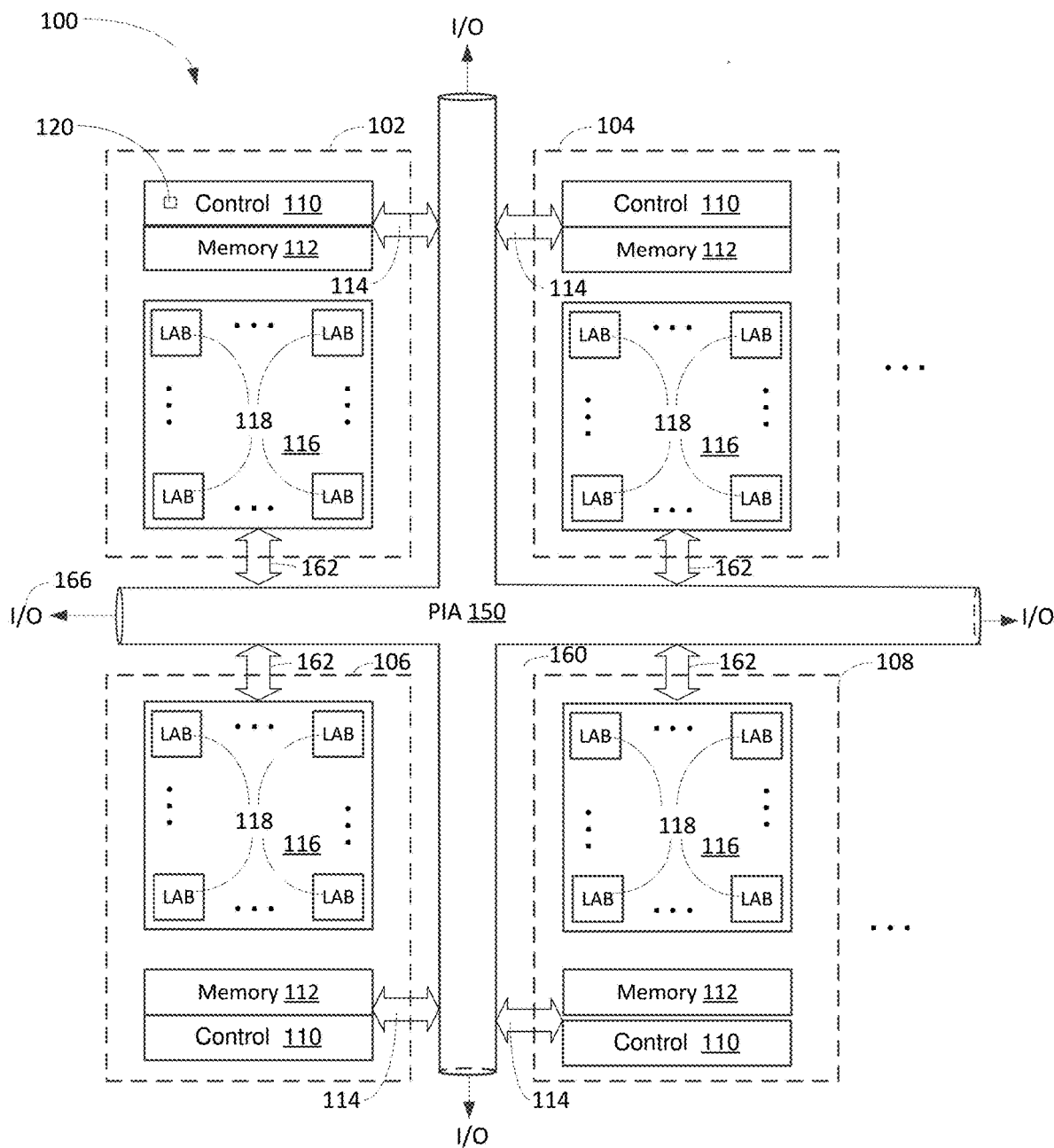

FIG. 1B is a block diagram illustrating a PIC containing multiple regions able to use the MBC process to improve its reliability in accordance with one embodiment of the present invention. To simplify the foregoing discussion, the terms "PSD", "PIC", FPGA, and PLD are referring the same or similar devices and they can be used interchangeably hereinafter. Diagram 100 includes multiple PPRs 102-108, PIA 150, and regional I/O ports 166. PPRs 102-108 further includes control units 110, memory 112, and LBs 116. Note that control units 110 can be configured into one single control unit, and similarly, memory 112 can also be configured into one single memory for storing configurations. It should be noted that the underlying concept of the exemplary embodiment(s) of the present invention would not change if one or more blocks (circuit or elements) were added to or removed from diagram 100.

LBs 116, also known as configurable function unit ("CFU") include multiple LABs 118 which is also known as a configurable logic unit ("CLU"). Each LAB 116, for example, can be further organized to include, among other circuits, a set of programmable logical elements ("LEs"), configurable logic slices ("CLS"), or macrocells, not shown in FIG. 1B. Each LAB, in one example, may include anywhere from 32 to 512 programmable LEs. I/O pins (not shown in FIG. 1B), LABs, and LEs are linked by PIA 150 and/or other buses, such as buses 162 or 114, for facilitating communication between PIA 150 and PPRs 102-108.

Each LE includes programmable circuits such as the product-term matrix, lookup tables, and/or registers. LE is also known as a cell, configurable logic block ("CLB"), slice, CFU, macrocell, and the like. Each LE can be independently configured to perform sequential and/or combinatorial logic operation(s). It should be noted that the underlying concept of PSD would not change if one or more blocks and/or circuits were added or removed from PSD.

Control units 110, also known as configuration logics, can be a single control unit. Control unit 110, for instance, manages and/or configures individual LE in LAB 118 based on the configuring information stored in memory 112. It should be noted that some I/O ports or I/O pins are configurable so that they can be configured as input pins and/or output pins. Some I/O pins are programmed as bi-directional I/O pins while other I/O pins are programmed as unidirectional I/O pins. The control units such as unit 110 are used to handle and/or manage PSD operations in accordance with system clock signals.

LBs 116 include multiple LABs that can be programmed by the end-user(s). Each LAB contains multiple LEs wherein each LE further includes one or more lookup tables ("LUTs") as well as one or more registers (or D flip-flops or latches). Depending on the applications, LEs can be configured to perform user-specific functions based on a predefined functional library facilitated by the configuration software. PSD, in some applications, also includes a set fixed circuit for performing specific functions. For example, the fixed circuits include, but not limited to, a processor(s), a DSP (digital signal processing) unit(s), a wireless transceiver(s), and so forth.

PIA 150 is coupled to LBs 116 via various internal buses such as buses 114 or 162. In some embodiments, buses 114 or 162 are part of PIA 150. Each bus includes channels or wires for transmitting signals. It should be noted that the terms channel, routing channel, wire, bus, connection, and interconnection are referred to as the same or similar connections and will be used interchangeably herein. PIA 150 can also be used to receive and/or transmits data directly or indirectly from/to other devices via I/O pins and LABs.

Memory 112 may include multiple storage units situated across a PPR. Alternatively, memories 112 can be combined into one single memory unit in PSD. In one embodiment, memory 112 is an NVM storage unit used for both configuration as well as user memory. The NVM storage unit can be, but not limited to, MRAM, flash, Ferroelectric RAM, and/or phase changing memory (or chalcogenide RAM). Depending on the applications, a portion of the memory 112 can be designated, allocated, or configured to be a block RAM ("BRAM") used for storing large amounts of data in PSD.

A PSD includes many programmable or configurable LBs 116 that are interconnected by PIA 150, wherein each programmable LB is further divided into multiple LABs 118. Each LAB 118 further includes many LUTs, multiplexers and/or registers. During configuration, a user programs a truth table for each LUT to implement a desired logical function. It should be noted that each LAB, which can be further organized to include multiple logic elements ("LEs"), can be considered as a configurable logic cell ("CLC") or slice. For example, a four-input (16 bit) LUT receives LUT inputs from a routing structure (not shown in FIG. 1B). Based upon the truth table programmed into LUT during configuration of PSD, a combinatorial output is generated via a programmed truth table of LUT in accordance with the logic values of LUT inputs. The combinatorial output is subsequently latched or buffered in a register or flip-flop before the clock cycle ends.

In one embodiment, control unit 110 includes an MBC module 120. It should be noted that MBC module 120 can be placed anywhere within PIC or PSD for facilitating the MBC process. A function of MBC module 120 is to control a configuration or rebooting process using user-defined configuration data or default configuration data ("DCD"). A benefit of using the MBC process is to recover or restore PIC or PSD from corrupted or incorrect configuration data.

Figure 2:
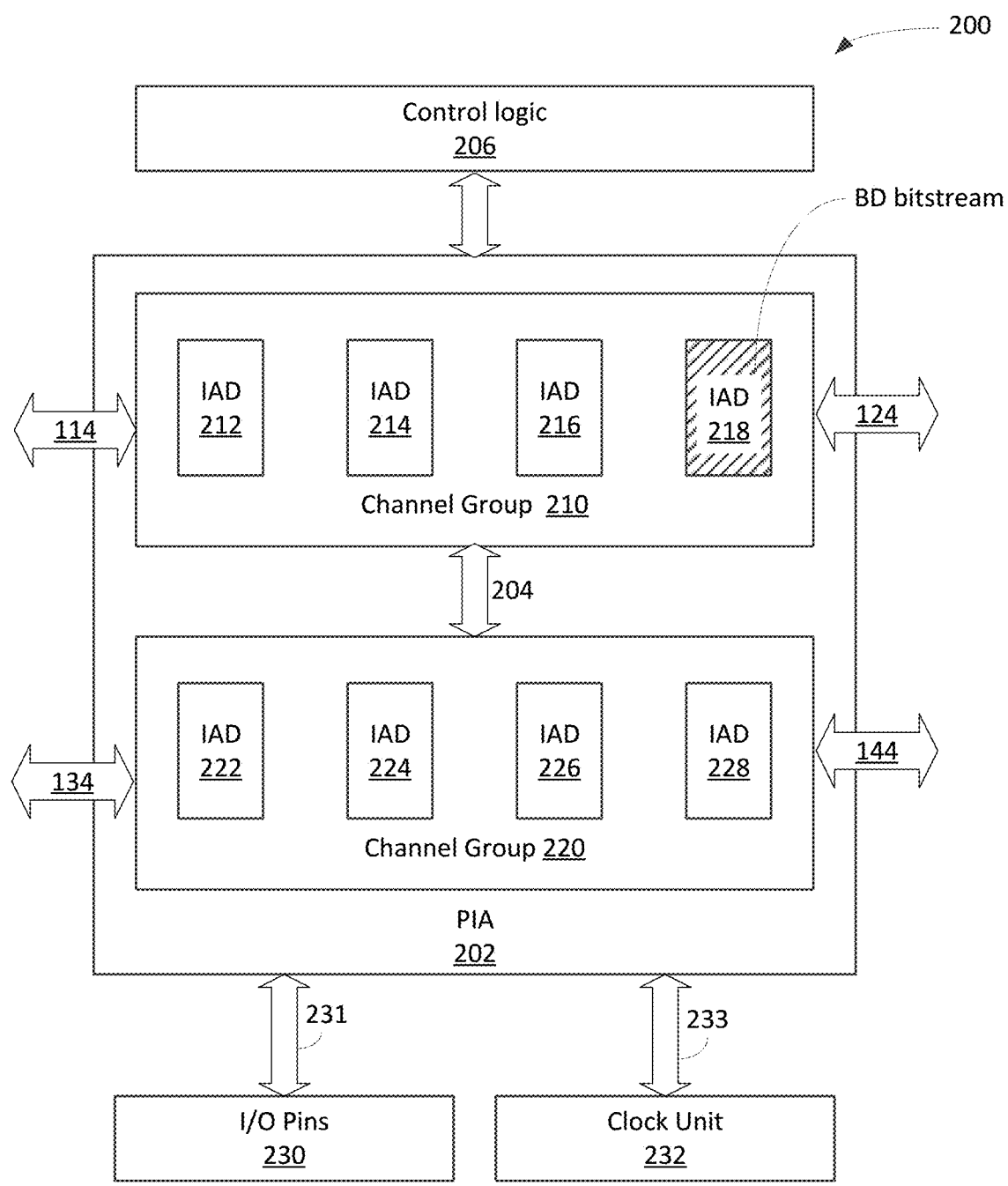
FIG. 2 is a block diagram illustrating a routing logic or routing fabric containing programmable interconnection arrays capable of routing a backup default ("BD") bitstream in accordance with one embodiment of the present invention.

FIG. 2 is a block diagram 200 illustrating a routing logic or routing fabric containing programmable interconnection arrays capable of routing a backup default ("BD") bitstream in accordance with one embodiment of the present invention. Diagram 200 includes control logic 206, PIA 202, I/O pins 230, and clock unit 232. Control logic 206, which may be similar to control units shown in FIG. 1B, provides various control functions including channel assignment, differential I/O standards, and clock management. Control logic 206 may contain volatile memory, non-volatile memory, and/or a combination of the volatile and nonvolatile memory device for storing information such as configuration data. In one embodiment, control logic 206 is incorporated into PIA 202. It should be noted that the underlying concept of the exemplary embodiment(s) of the present invention would not change if one or more blocks (circuit or elements) were added to or removed from diagram 200.

I/O pins 230, connected to PIA 202 via a bus 231, contain many programmable I/O pins configured to receive and/or transmit signals to external devices. Each programmable I/O pin, for instance, can be configured to input, output, and/or bi-directional pin. Depending on the applications, I/O pins 230 may be incorporated into control logic 206.

Clock unit 232, in one example, connected to PIA 202 via a bus 233, receives various clock signals from other components, such as a clock tree circuit or a global clock oscillator. Clock unit 232, in one instance, generates clock signals in response to system clocks as well as reference clocks for implementing I/O communications. Depending on the applications, clock unit 232, for example, provides clock signals to PIA 202 including reference clock(s).

PIA 202, in one aspect, is organized into an array scheme including channel groups 210 and 220, bus 204, and I/O buses 114, 124, 134, 144. Channel groups 210, 220 are used to facilitate routing information between LBs based on PIA configurations. Channel groups can also communicate with each other via internal buses or connections such as bus 204. Channel group 210 further includes interconnecting array decoders ("IADs") 212-218. Channel group 220 includes four IADs 222-228. A function of IAD is to provide configurable routing resources for data transmission.

IAD such as IAD 212 includes routing multiplexers or selectors for routing signals between I/O pins, feedback outputs, and/or LAB inputs to reach their destinations. For example, an IAD can include up to 36 multiplexers which can be laid out in four banks wherein each bank contains nine rows of multiplexers. It should be noted that the number of IADs within each channel group is a function of the number of LEs within the LAB.

PIA 202, in one embodiment, designates a special IAD such as IAD 218 for facilitating routing of configuration data. For example, IAD 218 is designated to handle connections and/or routings configuration information during bitstream transmission. It should be noted that additional IADs may be allocated for handling transmission of configuration data including BD bitstream.

An advantage of using IAD 218 within PIA as a designated bitstream routing is to ascertain the transmission of configuration bitstream between storage and configuration memory inside of PIC or FPGA.

Figure 3A:
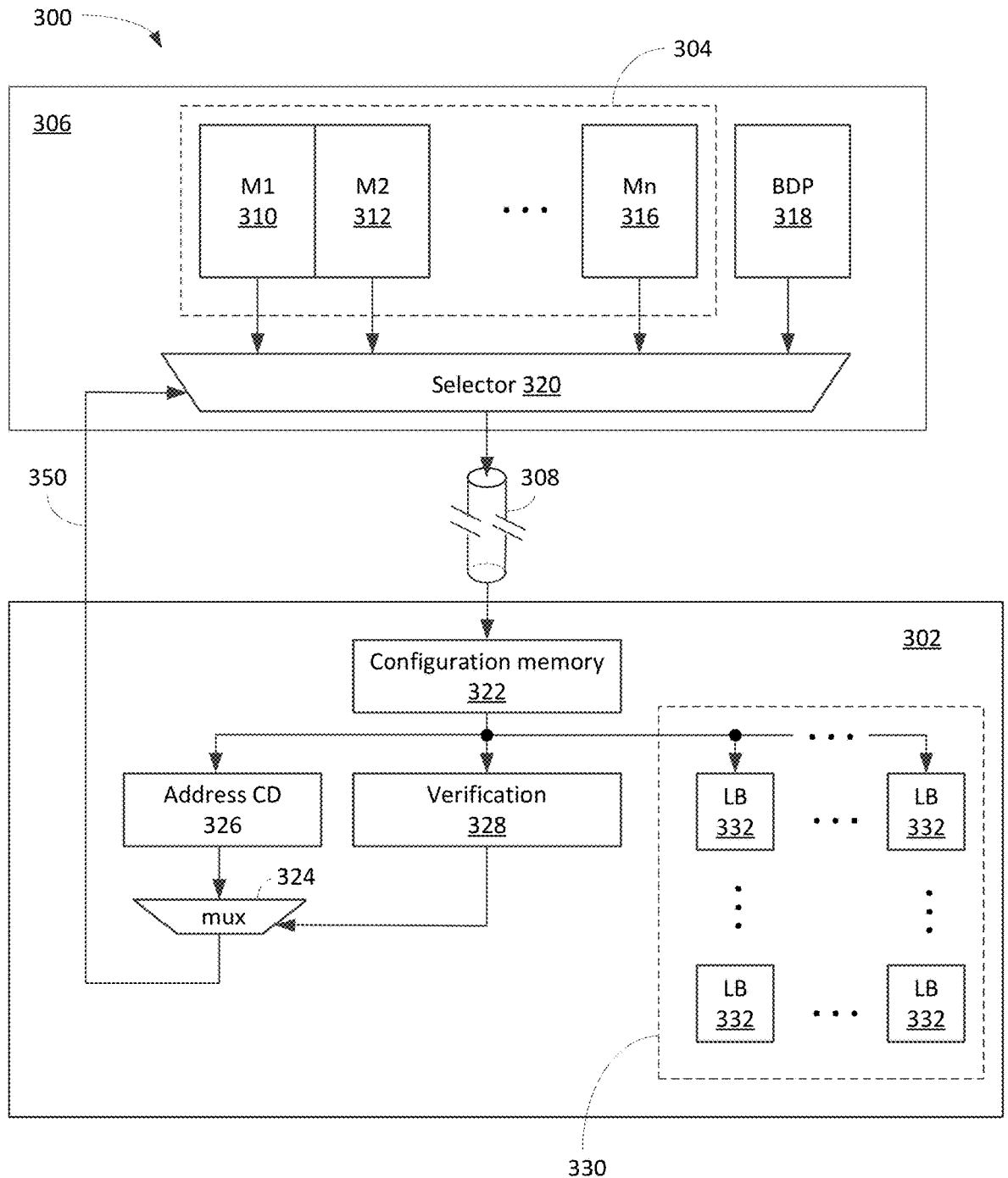
FIGS. 3A-3B are block diagrams illustrating a programmable semiconductor system ("PSS") containing a storage device and FPGA for facilitating an MBC process in accordance with one embodiment of the present invention.

FIG. 3A is a block diagram 300 illustrating a programmable semiconductor system ("PSS") containing a storage device and a PIC for facilitating an MBC process in accordance with one embodiment of the present invention. Diagram 300 includes a storage device 306, PIC (or FPGA) 302, and bus 308. Bus 308 may be an internal bus between chips fabricated on a module. Alternatively, bus 308 can be an independent bus such as Joint Test Action Group ("JTAG") operating between devices. It should be noted that the underlying concept of the exemplary embodiment(s) of the present invention would not change if one or more blocks (circuit or elements) were added to or removed from diagram 300.

PSS can also be referred to as a configurable semiconductor module containing multiple chips and/or integrated circuits ("ICs"). For example, PSS is a semiconductor module or card capable of housing PIC 302 and storage device 306 linked or connected by an internal bus 308. Alternatively, PSS can be a system-on-chip ("SOC") containing embedded PIC 302 and storage device 306 linked by an on-chip bus 308. With embedded wireless capabilities, PSS can be used to perform a variety of applications including, but not limited to, IA systems, autonomous vehicles, drones, ships, security monitoring, industry operations, robotic operations, home appliances, and the like.

PIC or PSD, in one aspect, includes an array of programmable logic 330, configuration memory 322, verification component 328, address of configuration data ("ACD") unit 326, and mux 324. The array of programmable logic further includes multiple configurable LBs 332 capable of being programmed to perform a set of user-specific functions. In one aspect, PIC further includes configurable routing connections that connect various LBs to facilitate the performance of the user desirable functions. Configuration memory 322, in one embodiment, is used to store configuration data ("CD") used to program configurable LBs 332 for carrying out user-defined logic functions. Each configurable LBs, for example, includes one or more LUTs used to provide one or more output signals in accordance with a set of input signals and CD in configuration memory 322.

Configuration memory 322, in one embodiment, can be a volatile memory or nonvolatile memory ("NVM"). The volatile memory, for instance, includes random-access memory ("RAM") or static random-access memory ("SRAM"). The NVM includes flash memory, MRAM, phase-change memory, and/or ferroelectric RAM ("FeRAM"). Configuration memory 322, in one aspect, is organized to store a bitstream of data representing CD for configuring various configurable elements, such as LBs and/or LUTs and configurable routing connections. A function of configuration memory 322 is to store user-provided or user-defined configuration bitstream for facilitating the delivery of the user-defined logic functions. In one embodiment, configuration memory 322 can be organized into multiple sections or portions capable of storing multiple versions of the CD.

Verification component 328, in one embodiment, is used to verify whether the CD or bitstreams in configuration memory 322 functions correctly. For example, verification component 328 which is coupled to LBs is capable of verifying and confirming the authenticity and integrity of recently loaded CD. For example, a predefined set of verification codes can be used by verification component 328 for the confirmation and verification process. It should be noted that the verification code can be provided by a user. Alternatively, the verification code can be provided by the manufacture of PIC or FPGA. If verification component 328 detects an incorrect CD or corrupted CD, a backup default ("BD") initiator is activated. The incorrect CD means that the CD is incorrectly generated or the CD is for a different logic function. The corrupted CD indicates that the CD may be corrupted during the transmission via wired or wireless communication.

Upon detecting the incorrect CD or corrupted CD, the BD initiator is activated to issue a BD signal indicating a new CD is needed or required. The BD initiator, not shown in FIG. 3A, can be a part of verification component 328 or an independent unit. In one embodiment, the BD signal is fed to a next CD mux 324 for loading or reloading a new CD from storage device 306 according to the memory location addressed by ACD unit 326.

ACD unit 326 retrieves or obtains memory location of the next CD pointed by a memory address. The memory address for the next CD, in one embodiment, is extracted from the current CD stored in configuration memory 322. Alternatively, the memory address for the next CD can be obtained from a BD address stored in an embedded memory if default CD ("DCD") is the next rebooting or reconfiguring code.

Storage device 306 includes user memory 304 and backup default page ("BDP") 318. User memory 304 includes multiple memory segments M1-Mn 310-316 capable of storing multiple copies or versions of the user-defined CD. For example, a user can generate and provide a primary CD, secondary CD, and golden CD wherein the primary CD, secondary CD, and golden CD may be loaded into M1 310, M2, 312, and Mn 316, respectively. Alternatively, user memory 304 is configured to store at least one user CD for supplying at least a portion of the CD in configuration memory 322. It should be noted that storage device 306 can be volatile memory, nonvolatile memory, or a combination of volatile and nonvolatile memory.

DBP 318, in one aspect, is configured to store DCD which is provided or offered by the PIC or FPGA manufacture. DCD is coded by the manufacture designed for rebooting PIC 302 to the manufacturing setting when all of the user-defined CDs fail to configure or reboot PIC 302. For instance, the DCD can be provided by manufacture or company which produces PIC 302. In one embodiment, BDP 318 is configured to be hidden from the user to prevent its content or DCD from being accidentally overwritten by a user. In one example, DBP 318 is a flash memory for storing DCD. In one aspect, the user CD or last user CD contains the address of memory location containing the next CD or DCD.

Bus 308, in one example, is a direct communication channel or connection between storage device 304 and PIC 302 for facilitating the passage or transmission of user CD and/or DCD from storage device 304 to configuration memory 322 of PIC 302. Depending on the application, bus 308 can use a bus protocol to transmit a bitstream and/or data. The bus protocol includes, but not limited to, serial peripheral interface ("SPI"), inter-integrated circuit ("I2C"), I3C (sense wire), universal asynchronous receiver-transmitter ("UART"), Integer ("Int"), two-wire interface ("TWI"), Timer, and the like. Bus 308, in one aspect, can be configured to be bi-directional. Alternatively, bus 308 is configured to be one directional.

$I^2C$, in one example, contains a multi-master, multi-slave, single-ended, and serial computer bus. An exemplary application of $I^2C$ is that it can be used for attaching lower-speed peripheral for short-distance and intra-board communication. The SPI bus is a synchronous serial communication interface specification used for short-distance communication, such as in embedded systems. In one example, SPI devices communicate in full-duplex mode using a master-slave architecture with a single master. The master device originates frames for reading and writing. It should be noted that SPI can also be referred to as a four-wire serial bus, as opposed to three-, two-, and one-wire serial buses. UART is a computer hardware device for asynchronous serial communication in which the data format and transmission speeds may be configurable. In one example, some electric signaling levels and methods are handled by a driver circuit external to the UART. I3C, also known as Sense Wire, provides connections between the chips using signaling patterns. I3C, for example, employs two wires wherein one wire (SCL) is used as a clock to define the sampling times and the other wire (SDA) being used as a data line.

In operation, upon receipt of an initial configuration trigger, a bitstream of CD is transmitted from storage device 306 to configuration memory 322 via bus 308. The initial configuration trigger includes internal triggering and external triggering. The internal triggering is due to its programmed logic function. The external triggering is due to the receipt of an external signal from another chip or device. The initial configuration trigger can also include a combination of internal and external triggering. If the newly loaded CD is verified, the configuration process performed by verification component 328 is ended. If, however, the newly loaded CD is not verified, reloading of CD from storage device 306 to configuration memory 322 is activated. If the maximum number of retry has not yet been reached, the same CD is reloaded or retransmitted. While a user can define the total number of retry, a counter is used to count or record the total number of retries occurred. When the user CD stored in storage device 306 is exhausted, ACD unit 326 retrieves the address of BDP 318 and selects DCD from BDP 319 via selector 320 as indicated by numeral 350. After DCD is loaded into configuration memory 322, PIC 302 will be booted or configured to its manufacturing setting.

An advantage of using the MBC process to reboot an FPGA is that it allows an FPGA to reboot to a manufacturing setting when user-defined CD fails to boot or configure FPGA whereby it enhances the overall reliability of FPGA.

Figure 3B:
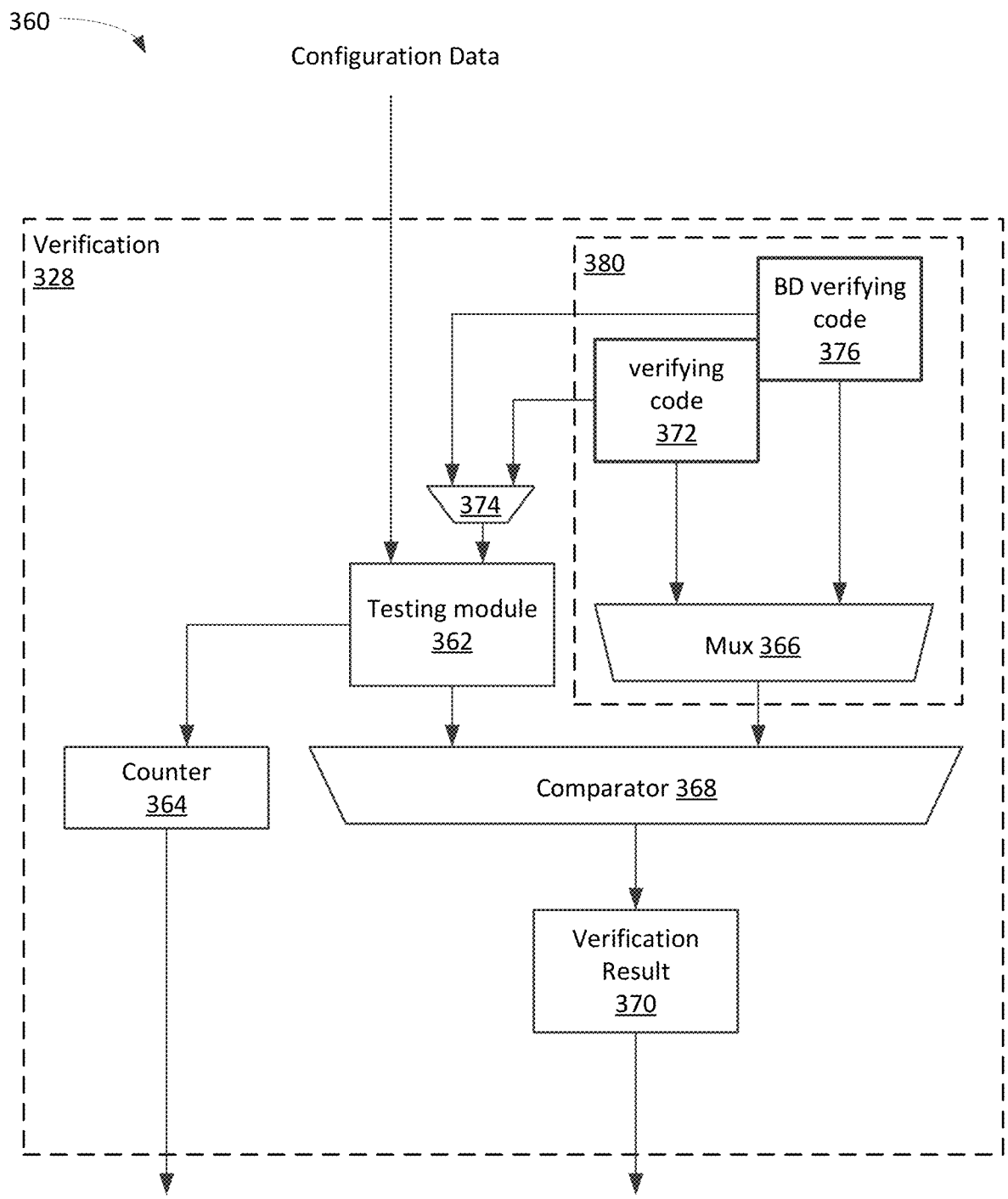

FIG. 3B is a logic block diagram 360 illustrating a logic process implemented by verification component 328 for verifying CD in accordance with one embodiment of the present invention. Verifying component 328 includes a testing code component 380, a testing module 362, a counter 364, a comparator 368, and a verification result unit 370. Testing code component 380, in one aspect, further includes a verifying code unit 372 and BD verifying code unit 376. Verifying code unit 372, for example, contains user provided verifying data for testing and verifying the user's CD. BD verifying code unit 376 includes manufacture provided verifying data for testing and verifying DCD. It should be noted that the underlying concept of the exemplary embodiment(s) of the present invention would not change if one or more blocks (circuit or elements) were added to or removed from diagram 360.

Upon receipt of a newly arrived CD, testing module 362 retrieves verifying data from testing code component 380. Depending on the source of CD, testing module 362 obtains verifying data either from verifying code unit 372 or BD verifying code unit 376. It should be noted that test code component 380 can be a local, embedded, and/or on-chip memory. If the CD is user-provided, testing module 362 selects verifying data from verifying code unit 372 via selector 374. Alternatively, if the CD is DCD, testing module 362 selects verifying data from BD verifying code unit 376 via selector 374. Testing module 362 subsequently performs a verification procedure to verify the integrity and operability of the newly arrived CD based on the verifying data from test code component 380.

Counter 364 is used to count total reloading times of the same CD from the storage device to PIC in accordance with a predefined verifying condition. The predefined verifying condition, for example, can be the number of verification procedures performed by test module 362. Alternatively, the predefined verifying condition can be the loading or reloading of CD from the storage device to the configuration memory. In one aspect, a user can set or predefine the number of reloading should be performed.

After the execution of the newly arrived CD in response to the verifying data, a testing result is generated by testing module 362 and subsequently fed to comparator 368. Upon selecting a predefined known value from testing code component 380, a comparison output is generated by comparator 368. It should be noted that the predefined known value can be selected either from verifying code unit 372 or BD verifying code unit 376 by mux 366 based on the source of CD (or DCD). For example, if the CD is provided by a user, the predefined known value is retrieved from verifying code unit 372. If, however, the CD is DCD, the predefined known value is retrieved from BD verifying code unit 376.

Upon receipt of the comparison output, verification result unit 370 determines whether the newly arrived CD is verified or whether reloading of CD is needed. In one aspect, verification result unit 370 includes BD initiator deciding whether DCD or another user-defined CD should be reloaded upon detecting the failed and/or corrupted CD currently in the configuration memory.

An advantage of employing verification component 328 is to enhance the reliability of PSS and/or FPGA even though the user-defined CD is corrupted or wrong.

Figure 4A:
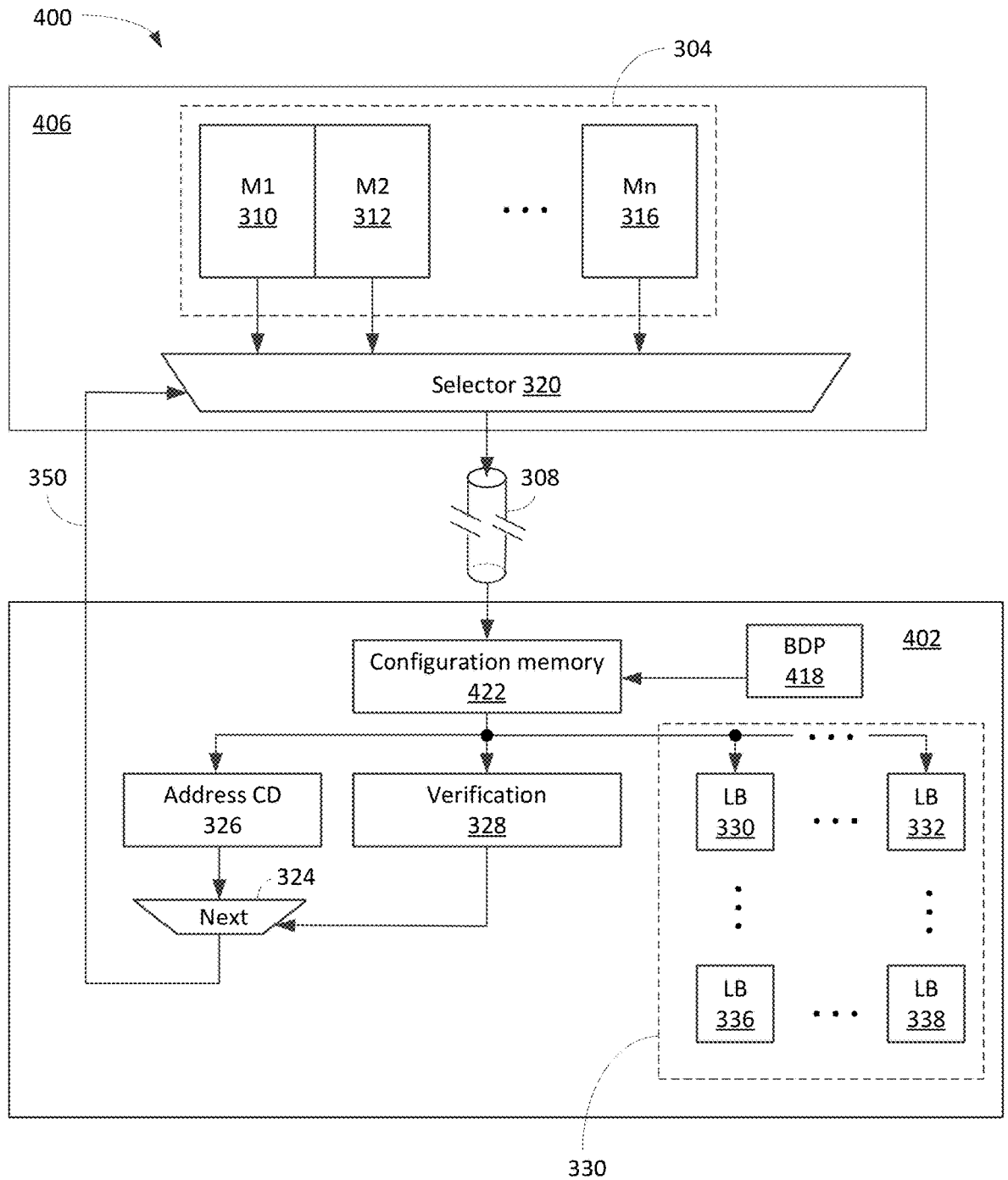
FIGS. 4A-4B show alternative embodiments illustrating a PSS or processing system containing a storage device and FPGA for facilitating an MBC process in accordance with one embodiment of the present invention.

FIG. 4A is a block diagram 400 illustrating PSS or processing system containing a storage device and FPGA for facilitating an MBC process in accordance with one embodiment of the present invention. Diagram 400 includes a storage device 406, PIC (or FPGA) 402, and bus 308. Bus 308 may be an internal bus between chips on a module or a bus such as Joint Test Action Group ("JTAG") operating between devices. Diagram 400 is similar to diagram 300 shown in FIG. 3A except that BDP 418 has been moved from the storage device (as shown in FIG. 3A) to FPGA or PIC 402 as an embedded memory in PIC 402. In one aspect, BDP 418 is situated in a flash memory situated inside of PIC 402. Alternatively, BDP 418 can also be placed in an embedded RAM or SRAM.

In one embodiment, an initial or first CD for rebooting or configuring PIC 402 is preferably located at external storage such as storage device 406 via a bus 308. The initial or first CD, which can also be referred to as primary CD or bitstream, is prepared and provided by a user for carrying out user-defined logic functions. A benefit of loading CD from an external device is that it may allow a user to control and/or modify the source of CD in real-time through the operation of user-defined or programmed logic in FPGA.

Figure 4B:
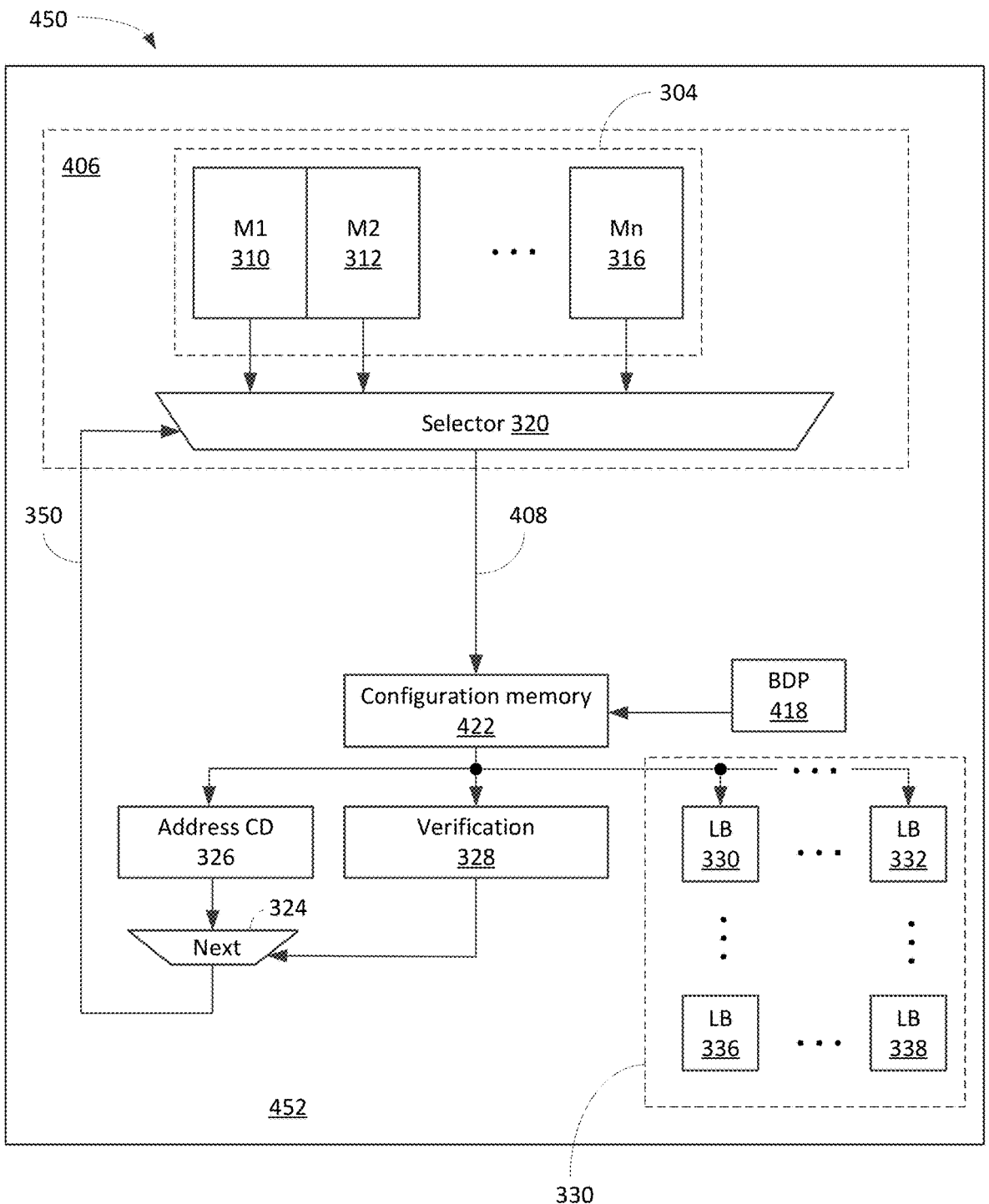

FIG. 4B is a block diagram 450 illustrating PSS or processing system situated within FPGA 452 for facilitating an MBC process in accordance with one embodiment of the present invention. Diagram 450 shows FPGA 452 that includes storage device 406, connection(s) 408, configuration memory 422, verification unit 328, and configurable LBs 330. Diagram 450 is similar to diagram 400 shown in FIG. 4A except that storage device 406 and connection (bus) 408 are embedded inside of FPGA or PIC 452. In one aspect, storage device 406 can be a non-volatile memory, volatile memory, and/or a combination of volatile and non-volatile memory.

It should be noted that FPGA or PIC 302 illustrated in FIG. 3A is generally categorized as volatile FPGA. PIC 402 may be categorized as non-volatile FPGA or PIC because it contains an embedded non-volatile memory storing a copy of the CD. For instance, the information on user-defined logic configuration persists upon termination of the power source.

An advantage of having a storage to be embedded in PIC is that it allows a system-on-chip (SOC) design applicable to many applications including but not limited to remote security monitoring systems, drones, cars, ships, and the like.

Figure 5A:
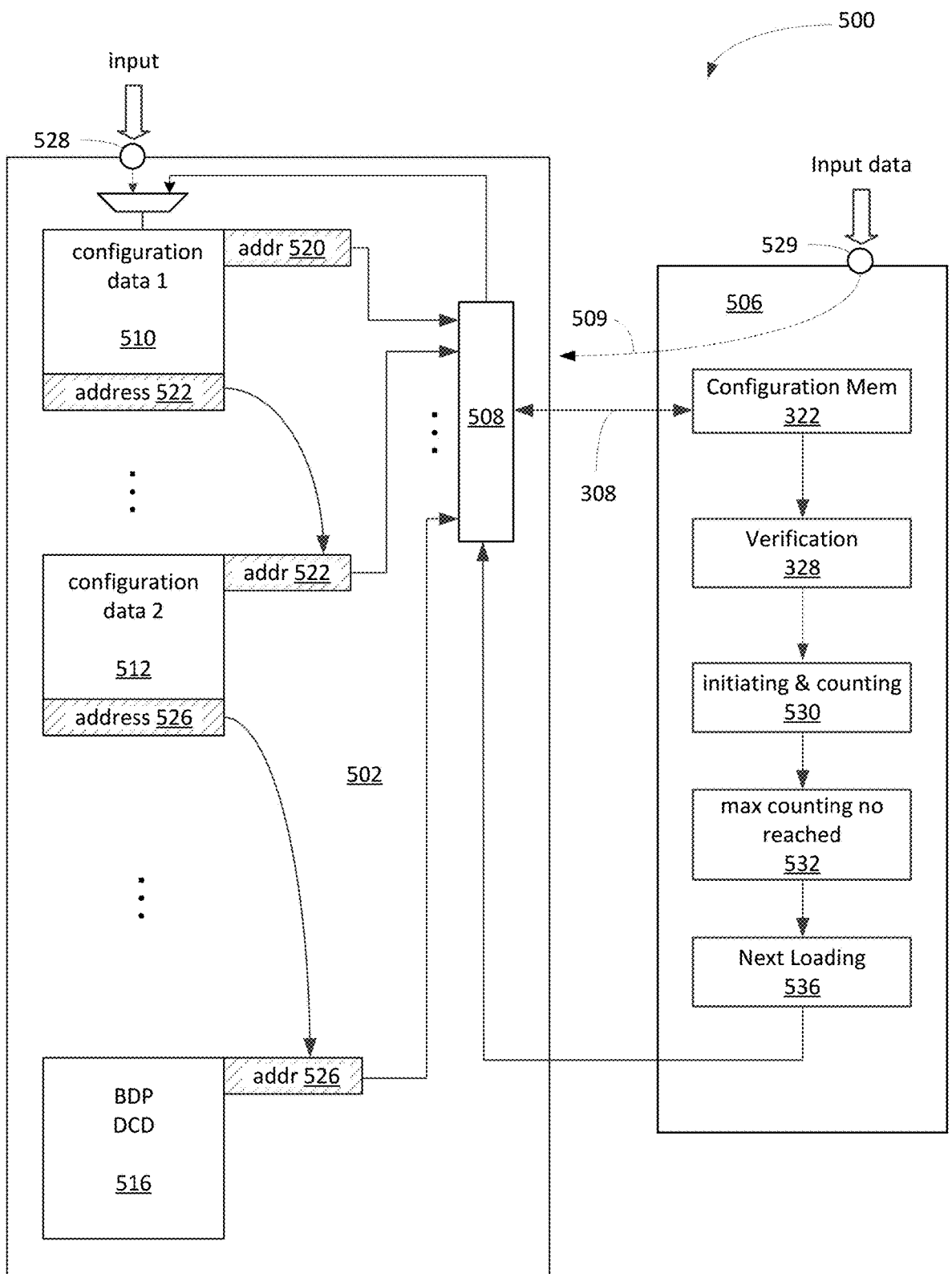
FIGS. 5A-5B are block diagrams illustrating a programmable semiconductor system containing a PIC capable of facilitating a multi-boot or dual boot operation in accordance with one embodiment of the present invention.

FIG. 5A is a block diagram 500 illustrating a programmable semiconductor system containing a PIC capable of facilitating a multi-boot or dual boot operation in accordance with one embodiment of the present invention. Diagram 500 includes a storage device 502, PIC (or FPGA) 506, and selector 508. In one aspect, the output of selector 508 is fed to PIC 506 via a connection or bus 308. It should be noted that the underlying concept of the exemplary embodiment(s) of the present invention would not change if one or more blocks (circuit or elements) were added to or removed from diagram 500.

Storage device 502 is organized to store multiple sets or versions of CDs 510-516 wherein each CD is referenced or addressed by an address such as address 520 pointing to CD 510. For example, CDs 510-516 can be loaded, referenced, and/or addressed by addresses 520-526. In one embodiment, each CD contains a specific predefined address location which is used to address the location of the next CD or DCD. The specific predefined address location, in one aspect, can be assigned or specified by a user. For instance, the last 4 bytes of CD bitstream are designated for storing the address of a memory location containing the next CD. For example, the last portion of CD 510 contains address 522 which points to a memory location containing the next CD 512. In one embodiment, the last user-defined CD includes the memory address of BDP. For example, the user CD 512 includes a memory address 526 pointing or addressing a memory location storing DCD 516. In one embodiment, storage device 502 contains a communication port 528 which is used to receive user and/or manufacture defined CD(s).

PIC 506, in one aspect, includes a configuration memory 322, verification unit 328, initiating and counting unit 530, maximum number unit 532, and next loading unit 536. Upon detecting defective CD, the counter is incremented to indicate the total loading times for the present CD. If the maximum number of loading times has not been reached, an initiator begins to initiate reloading of the CD from storage device 502. If the maximum number of loading times has been reached, the initiator begins to identify and retrieve the address of memory location containing the new CD including DCD. Upon retrieving an address from the CD currently in configuration memory 322, next loading unit 536 selects a memory location storing the next CD for CD reloading via selector 508.

PIC 506, in one embodiment, includes a port 529 used to communicate with a user situated geographically away from PSS. Port 529 can be set to receive certain types of information, data, or input from external devices via a communication network. Upon receipt of input via port 529, the input data can be forwarded to storage device 502 as indicated by numeral 509. It should be noted that the input data can be any types of data including but not limited to user data and CD.

PSS is a configurable semiconductor device containing PIC 506 and storage device 502. PIC 506, in one example, includes a set of configurable LBs, an array of routing connections, and a configuration memory 322 for performing programmed logic functions. Each of the configurable LBs including multiple LUTs configured to provide one or more output signals in accordance with a set of input signals and CD in configuration memory 322.

Storage device 502 stores at least one CD containing a user's functional data in a storage location addressed by an address such as CD1 is referenced by address 520. In this embodiment, storage device 502 further stores a second CD containing second user functional data in a second storage location such as CD2 referenced by address 522. In one aspect, CD1 includes a memory address 522 which addresses a memory location storing CD2 512.

An advantage of having a CD containing an address of the next CD is that it allows the PIC to be automatically rebooted or configured using the next CD or DCD without substantial external intervention. External intervention includes, but not limited to, control signals from external devices and/or systems.

Figure 5B:
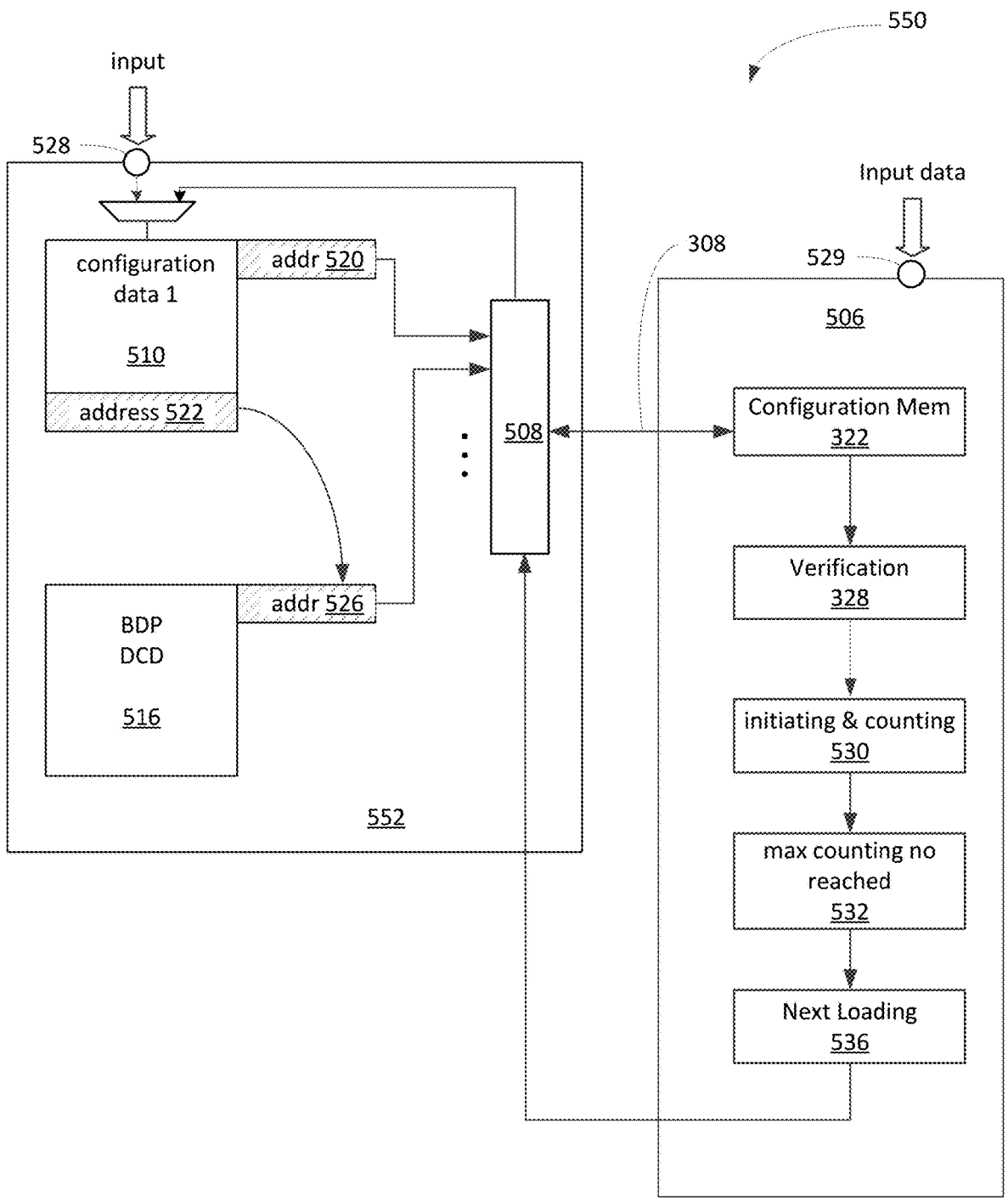

FIG. 5B is a block diagram 550 illustrating a programmable semiconductor system containing a PIC capable of facilitating a dual boot operation in accordance with one embodiment of the present invention. Similar to diagram 500 shown in FIG. 5A, diagram 550 includes a storage device 552, PIC (or FPGA) 506, and selector 508. In one aspect, storage device 552 contains a primary CD 510 and a secondary or backup CD 516. In the event that the primary CD 510 is defective due to wrong coding or corrupted bitstream due to transmission error, the secondary or backup CD 516 is downloaded to reboot or configure PIC 506. It should be noted that the underlying concept of the exemplary embodiment(s) of the present invention would not change if one or more blocks (circuit or elements) were added to or removed from diagram 550.

Figure 6A:
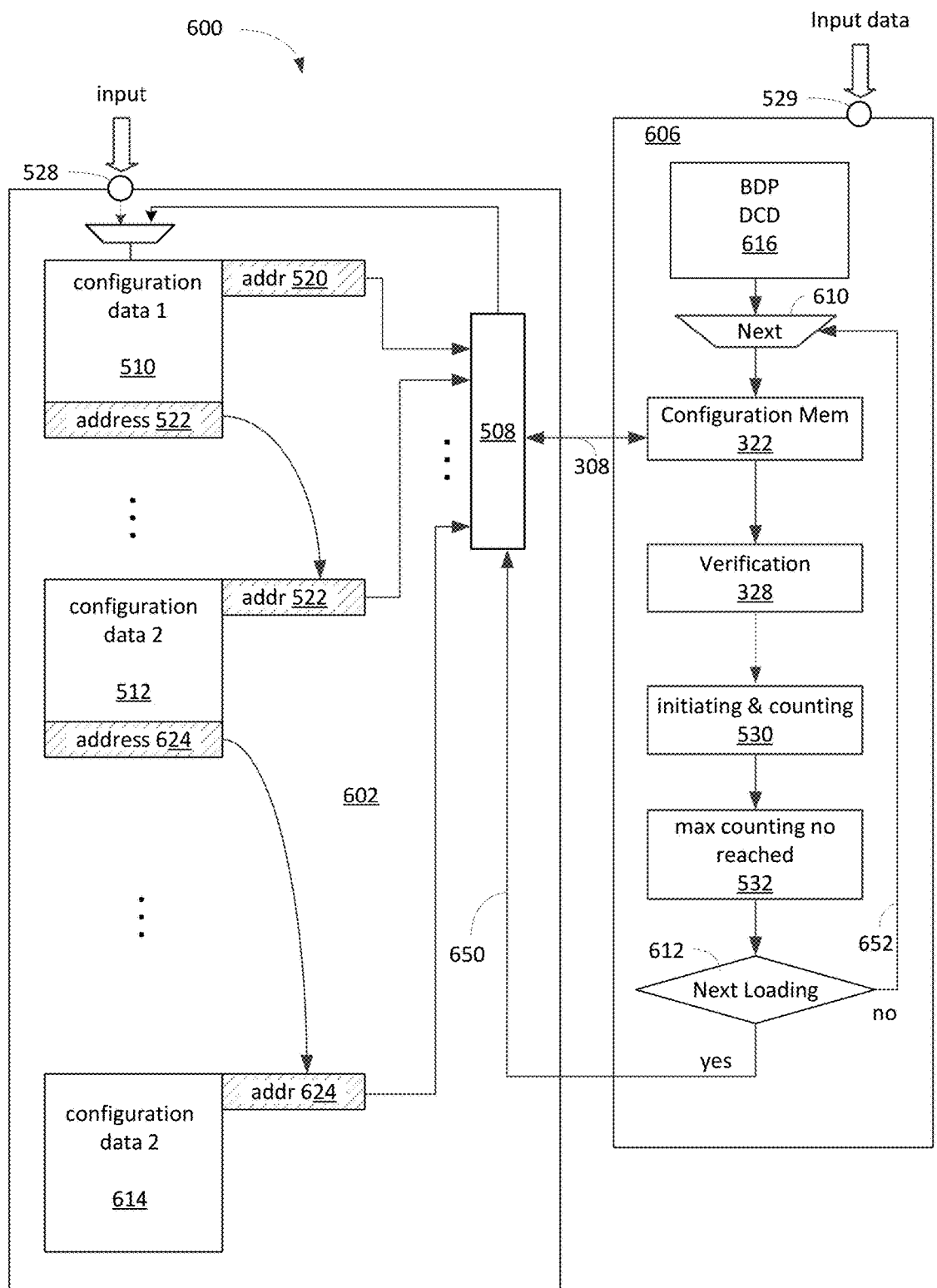
FIG. 6A is a block diagram illustrating a programmable semiconductor system containing a PIC capable of facilitating a multi-boot or dual boot operation in accordance with one embodiment of the present invention.

FIG. 6A is a block diagram 600 illustrating a programmable semiconductor system containing a PIC capable of facilitating a multi-boot or dual boot operation in accordance with one embodiment of the present invention. Diagram 600 includes a storage device 602, PIC (or FPGA) 606, and selector 508. In one aspect, the output of selector 508 is fed to PIC 506 via a connection or bus. Storage device 602 is organized to store multiple sets or versions of CDs 510-512, 614 which can be loaded, referenced, and/or addressed by addresses 520-522, 624. It should be noted that the underlying concept of the exemplary embodiment(s) of the present invention would not change if one or more blocks (circuit or elements) were added to or removed from diagram 600.

Diagram 600 is similar to diagram 500 shown in FIG. 5A except that BDP 616 has been moved from the storage device (as shown in FIG. 5A) to FPGA or PIC 606 as an embedded memory in PIC 606. In one aspect, BDP 616 containing DCD is situated in a flash memory embedded in PIC 606. Alternatively, BDP 616 can also be placed in a RAM or SRAM embedded in PIC 606. During operation, upon detecting an incorrect, defective, and/or corrupted CD in configuration memory 322, network loading unit 612 identifies a new memory location containing the next user CD when the next user CD is available in storage device 602 as indicated by numeral 650.

Alternatively, upon detecting the defective CD, network loading unit 612 selects DCD from BDP 616 via mux 610 when the user-defined CD is exhausted. It should be noted that the exhaustion of user-defined CD means that none of the user-defined CDs in the storage device can reboot FPGA or PIC. Depending on the applications, CD in configuration memory 322 can be configured to contain an address pointing to a memory location storing BDP 616. Alternatively, PIC 606 is set to store the address of BDP 616 internally.

Figure 6B:
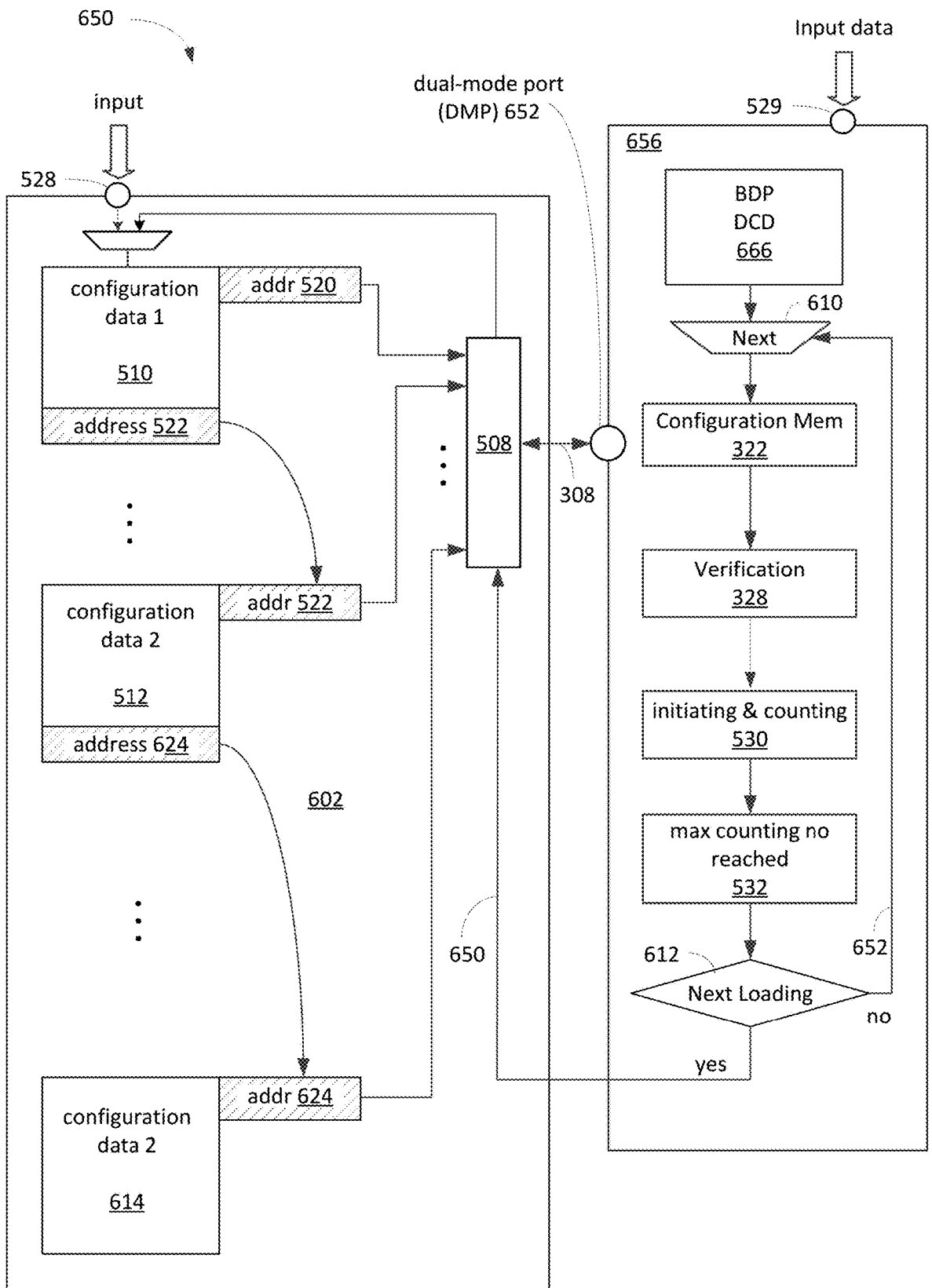
FIG. 6B is a block diagram illustrating a programmable semiconductor system containing a dual-mode port ("DMP") for facilitating a configuration and a user data operation in accordance with one embodiment of the present invention.

FIG. 6B is a block diagram 650 illustrating a PSS containing a dual-mode port ("DMP") 652 for providing dual purposes in accordance with one embodiment of the present invention. Diagram 650, which is similar to diagram 600 shown in FIG. 6A, includes a configurable semiconductor device or PSS containing a storage device 602, PIC (or FPGA) 656, and selector 508. In one aspect, PIC 656 includes DMP 652 capable of facilitating communication between selector 508 and configuration memory 322. It should be noted that DMP 652 can also be referred to as a dual-mode pin, a dual-purpose port, or a dual-purpose pin. To simplify forgoing discussion, DMP is used in reference to a dual-mode pin, a dual-purpose port, or a dual-purpose pin. It should be noted that the underlying concept of the exemplary embodiment(s) of the present invention would not change if one or more blocks (circuit or elements) were added to or removed from diagram 650.

Storage device 602, in this example, is used to store various versions of CD representing user-defined logic functions, and a bus is used to couple storage device 602 to DMP 652 via selector 508 for data transmission. PIC 656, in one embodiment, includes DMP 652 for transmitting CD during the configuration period. After PIC 656 is programmed or configured, DMP 652 is switched to handle the user data. PIC 656, in one example, includes one or more DMPs, configurable LBs, routing connections, and configuration memory 322, verification unit 328, initiating and counting unit 530, maximum number unit 532, and next loading unit 612. While configuration memory 322 stores the current version of CD, each configurable LBs includes LUTs configured to provide output signals in accordance with a set of input signals and the CD.

PIC 656, in one embodiment, further includes a DMP switch not shown in FIG. 6B, configured to identify and/or schedule when DMP 652 should switch between a configuration mode and a logic operation mode. The DMP switch, also known the pin controller, can be an independent module or a part of the FPGA controller. A function of the DMP switch is to ascertain that DMP can be recovered or continue to operate even after discovery the defect(s) of the DC currently in configuration memory 322.

DMP 652 is operable to handle the configuration data during a configuration mode and able to handle user data during a logic operation mode. In one embodiment, DMP 652 is set (or switched) to the configuration mode when the DMP is used for loading or transmitting CD from the storage via the bus. After configuration phase, DMP 652 is switched or reset to the logic operation mode thereby the DMP is used to handle or transmit user data.

Storage device 602 includes a memory section configured to store at least one user provided CD such as CD 510 for supplying at least a portion of the CD. In one embodiment, the CD includes command signals used to instruct or facilitate DMP 652 to switch between the two modes for handling configuration data as well as user data. The two modes refer to the configuration mode and logic operation mode. BDP 666, in one embodiment, contains DCD which also includes signals to instruct DMP 652 to switch between the two modes for facilitating handling configuration data as well as user data.

Figure 7:
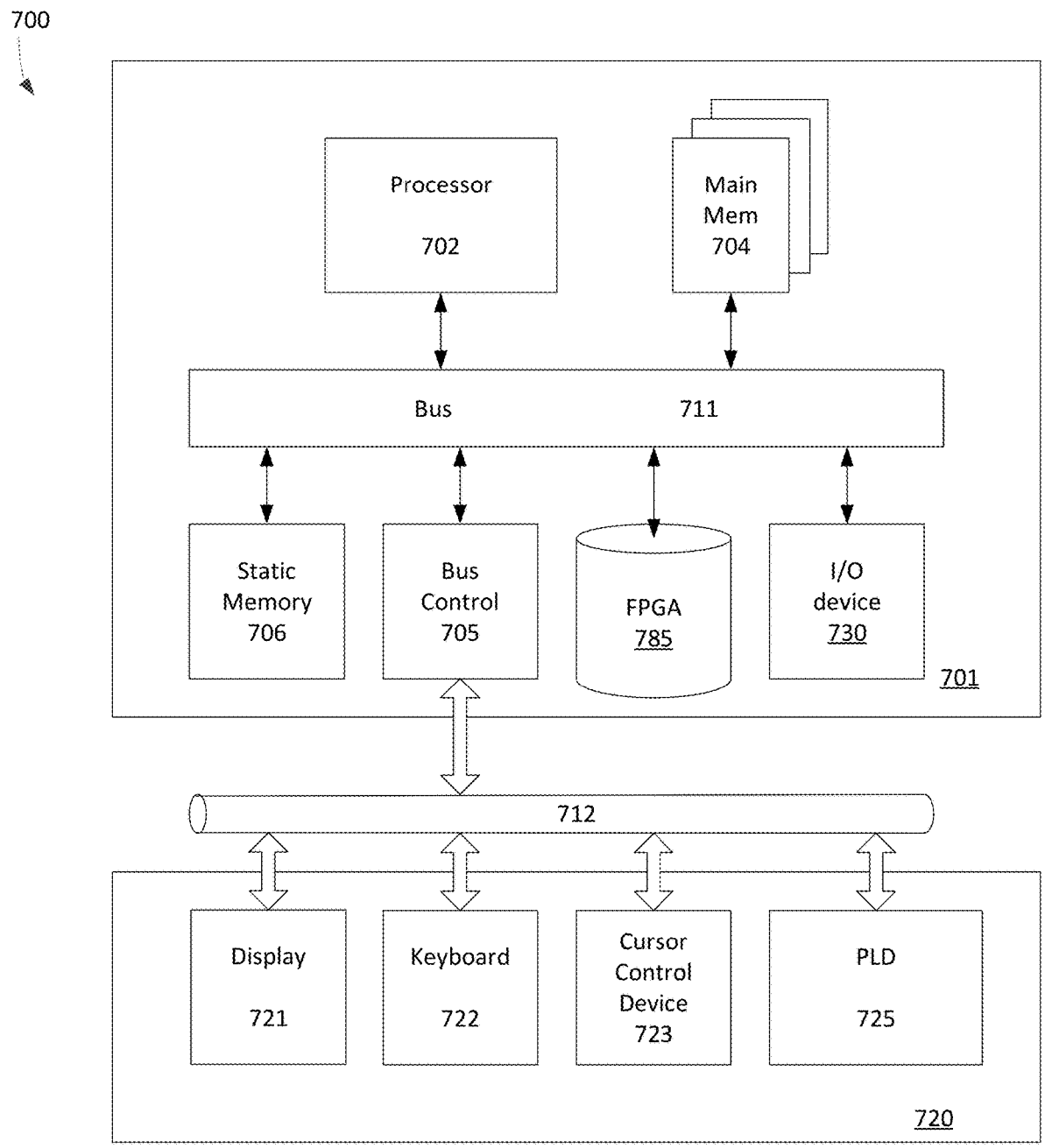
FIG. 7 is a diagram illustrating a system or computer using PSS and/or PIC able to provide an MBC process to enhance programmability of PIC in accordance with one embodiment of the present invention.

FIG. 7 is a block diagram 700 illustrating a system or computer using PSS and/or PIC able to provide an MBC process to enhance the programmability of PIC in accordance with one embodiment of the present invention. Computer system 700 includes a processing unit 701, an interface bus 712, and an input/output ("IO") unit 720. Processing unit 701 includes a processor 702, main memory 704, system bus 711, static memory device 706, bus control unit 705, I/O element 730, and FPGA 785. It should be noted that the underlying concept of the exemplary embodiment(s) of the present invention would not change if one or more blocks (circuit or elements) were added to or removed from FIG. 7.

Bus 711 is used to transmit information between various components and processor 702 for data processing. Processor 702 may be any of a wide variety of general-purpose processors, embedded processors, or microprocessors such as ARM® embedded processors, Intel® Core™ Duo, Core™ Quad, Xeon®, Pentium™ microprocessor, Motorola™ 68040, AMD® family processors, or Power PC™ microprocessor.

Main memory 704, which may include multiple levels of cache memories, stores frequently used data and instructions. Main memory 704 may be RAM (random access memory), MRAM (magnetic RAM), or flash memory. Static memory 706 may be a ROM (read-only memory), which is coupled to bus 711, for storing static information and/or instructions. Bus control unit 705 is coupled to buses 711-712 and controls which component, such as main memory 704 or processor 702, can use the bus. Bus control unit 705 manages the communications between bus 711 and bus 712. Mass storage memory or SSD which may be a magnetic disk, an optical disk, hard disk drive, floppy disk, CD-ROM, and/or flash memories are used for storing large amounts of data.

I/O unit 720, in one embodiment, includes a display 721, keyboard 722, cursor control device 723, and low-power PLD 725. Display device 721 may be a liquid crystal device, cathode ray tube ("CRT"), touch-screen display, or other suitable display devices. Display 721 projects or displays images of a graphical planning board. Keyboard 722 may be a conventional alphanumeric input device for communicating information between computer system 700 and computer operator(s). Another type of user input device is cursor control device 723, such as a conventional mouse, touch mouse, trackball, or other types of the cursor for communicating information between system 700 and user(s).

PLD 725 is coupled to bus 712 for providing configurable logic functions to local as well as remote computers or servers through a wide-area network. PLD 725 and/or FPGA 785 are configured to facilitate the operation of the MBC process to improve the reliability of FPGA and/or PLD. In one example, PLD 725 may be used in a modem or a network interface device for facilitating communication between computer 700 and the network. Computer system 700 may be coupled to servers via a network infrastructure as illustrated in the following discussion.

Figure 8:
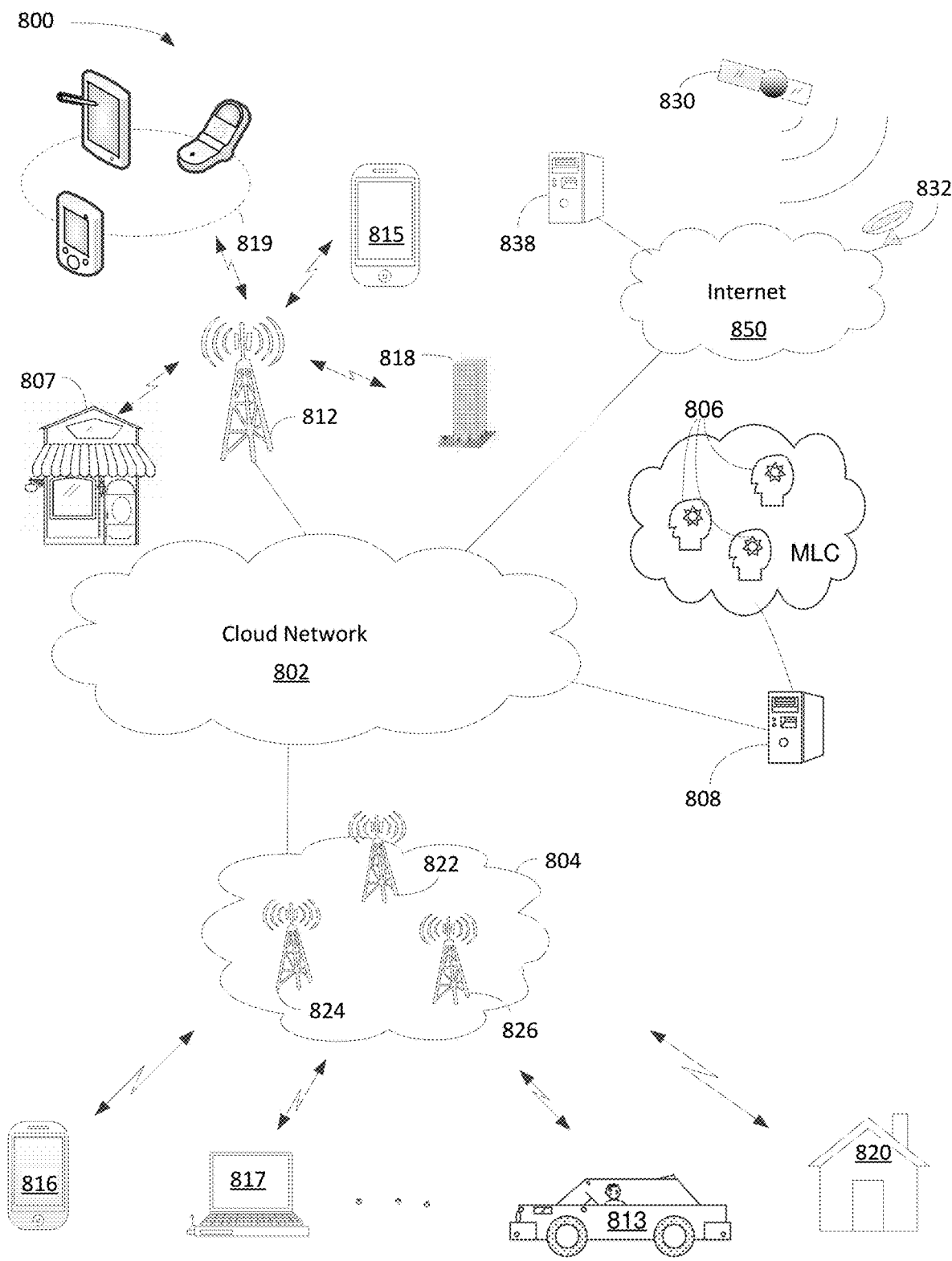
FIG. 8 is a block diagram illustrating various applications of PSS or PSD containing FPGA or PLD capable of facilitating an MBC process for improving overall reliability in accordance with one embodiment of the present invention.

FIG. 8 is a block diagram 800 illustrating various applications of PSS or PSD containing FPGA or PLD capable of facilitating an MBC process for improving overall reliability in accordance with one embodiment of the present invention. Diagram 800 illustrates AI server 808, communication network 802, switching network 804, Internet 850, and portable electric devices 813-819. In one aspect, PSD capable of facilitating MBC operation is used in an AI server, portable electric devices, and/or switching network. Network or cloud network 802 can be a wide area network, metropolitan area network ("MAN"), local area network ("LAN"), satellite/terrestrial network, or a combination of a wide-area network, MAN, and LAN. It should be noted that the underlying concept of the exemplary embodiment(s) of the present invention would not change if one or more blocks (or networks) were added to or removed from diagram 800.

Network 802 includes multiple network nodes, not shown in FIG. 8, wherein each node may include mobility management entity ("MME"), radio network controller ("RNC"), serving gateway ("S-GW"), packet data network gateway ("P-GW"), or Home Agent to provide various network functions. Network 802 is coupled to Internet 850, AI server 808, base station 812, and switching network 804. Server 808, in one embodiment, includes machine learning computers ("MLC") 806.

Switching network 804, which can be referred to as packet core network, includes cell sites 822-826 capable of providing radio access communication, such as 3G (3$^{rd}$ generation), 4G, or 5G cellular networks. Switching network 804, in one example, includes IP and/or Multiprotocol Label Switching ("MPLS") based network capable of operating at a layer of Open Systems Interconnection Basic Reference Model ("OSI model") for information transfer between clients and network servers. In one embodiment, switching network 804 is logically coupling multiple users and/or mobiles 816-820 across a geographic area via cellular and/or wireless networks. It should be noted that the geographic area may refer to campus, city, metropolitan area, country, continent, or the like.

Base station 812, also known as cell-site, node B, or eNodeB, includes a radio tower capable of coupling to various user equipments ("UEs") and/or electrical user equipments ("EUEs"). The term UEs and EUEs are referring to similar portable devices and they can be used interchangeably. For example, UEs or PEDs can be cellular phone 815, laptop computer 817, iPhone® 816, tablets, and/or iPad® 819 via wireless communications. A handheld device can also be a smartphone, such as iPhone®, BlackBerry®, Android®, and so on. Base station 812, in one example, facilitates network communication between mobile devices such as portable handheld device 813-819 via wired and wireless communications networks. It should be noted that base station 812 may include additional radio towers as well as other land switching circuitry.

Internet 850 is a computing network using Transmission Control Protocol/Internet Protocol ("TCP/IP") to provide linkage between geographically separated devices for communication. Internet 850, in one example, couples to supplier server 838 and satellite network 830 via satellite receiver 832. Satellite network 830, in one example, can provide many functions as wireless communication as well as a global positioning system ("GPS"). It should be noted that the MBC operation enhancing the reliability of FPGA can benefit many applications, such as but not limited to, smartphones 813-819, satellite network 830, automobiles 813, AI servers 808, business 807, and homes 820.

The exemplary embodiment of the present invention includes various processing steps, which will be described below. The steps of the embodiment may be embodied in machine or computer-executable instructions. The instructions can be used to cause a general-purpose or special-purpose system, which is programmed with the instructions, to perform the steps of the exemplary embodiment of the present invention. Alternatively, the steps of the exemplary embodiment of the present invention may be performed by specific hardware components that contain hard-wired logic for performing the steps, or by any combination of programmed computer components and custom hardware components.

Figure 9:
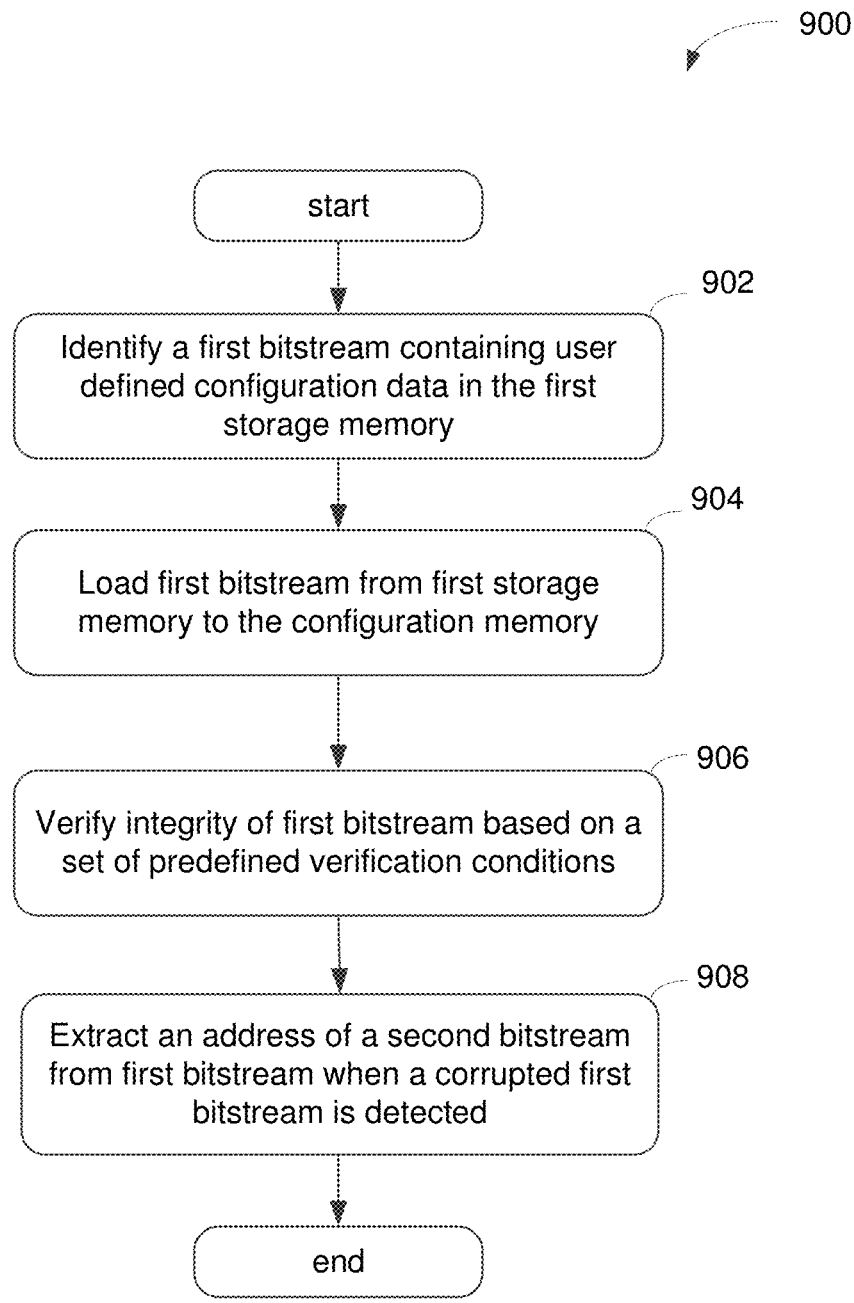
FIG. 9 is a flowchart illustrating a process of configuring PIC facilitating an MBC process in accordance with one embodiment of the present invention.

FIG. 9 is a flowchart 900 illustrating a process of configuring PIC facilitating an MBC process in accordance with one embodiment of the present invention. At block 902, a process of configuring an FPGA includes identifying a first bitstream containing user-defined CD stored in the first storage memory via a communication channel.

At block 904, the first bitstream of CD is loaded or transmitted from the first storage memory to the configuration memory in the FPGA. It should be noted that the first storage memory can be a chip or integrated circuit ("IC") on the module. Alternatively, the first storage memory can be a flash memory embedded in FPGA.

At block 906, the process is capable of verifying the integrity as well as functionalities of the first bitstream of CD based on a set of predefined verification conditions to ascertain that the first bitstream of CD is not defective.

At block 908, an address of memory location containing a second bitstream is extracted from the first bitstream of the CD when a corrupted or defective first bitstream is detected. In one embodiment, the second bitstream of the second CD is loaded from the storage location addressed by the address of the memory location storing the second bitstream. For example, the process identifies the address of the memory location containing the second bitstream in a predefined location of the first bitstream.

In one embodiment, the process verifies the integrity as well as the functionality of the second bitstream based on the second set of predefined verification conditions or verifying code to ascertain that PIC will function properly with the second bitstream of CD. The process is further capable of identifying an address of the BDP containing manufacture default configuration settings in a predefined location of the second bitstream when a corrupted or defective second bitstream is detected. In one aspect, after extracting the address of the BDP from the second bitstream from its bit position or location, FPGA is rebooted or configured via DCD from the BDP to a manufacturing default setting.

Figure 10:
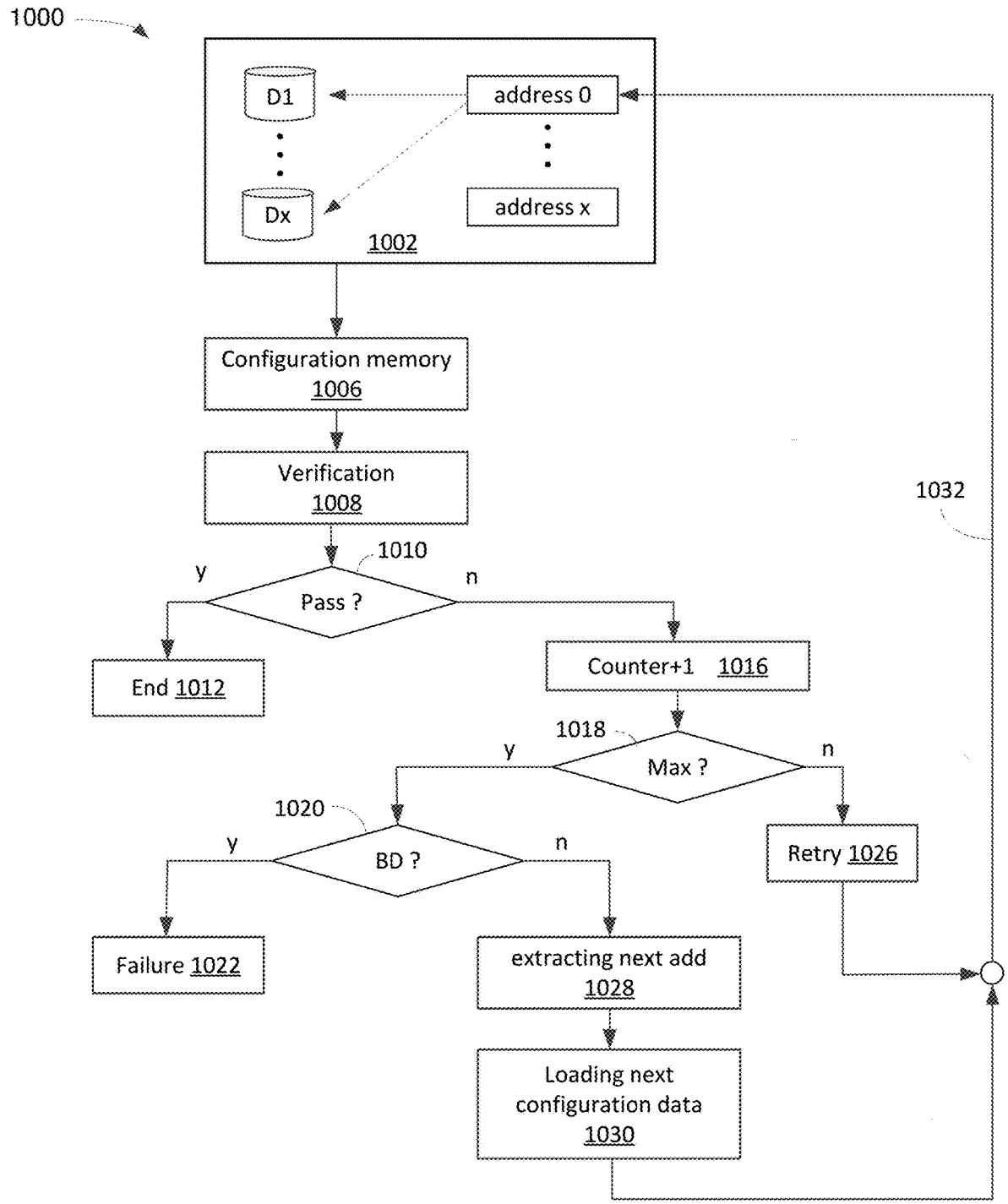
FIG. 10 is a logic flow diagram illustrating a process of configuring PIC via an MBC process in accordance with one embodiment of the present invention.

FIG. 10 is a logic flow diagram 1000 illustrating a process of configuring PIC via an MBC process in accordance with one embodiment of the present invention. At block 1002, a DC such as D1 is loaded into configuration memory at block 1006. After DC verification at block 1008, a verification result, at block 1010, is examined to determine whether the DC in the configuration memory is good and functionally checked. If the DC is good and not defective, the process ends at block 1012. If the DC is defective, the process increments the counter at block 1016 and proceeds to next block 1018.

At block 1018, the process determines whether a maximum number of DC loading has been reached. If the maximum number has not been reached, the process proceeds to retry at block 1026 and the reloading begins as indicated by numeral 1032. If the maximum number has been reached, the process proceeds to check whether the data in the configuration memory is DCD or BD. If it is DCD, the process proceeds to block 1022 and issues a failure signal indicating that PIC is defective. If the data in the configuration memory is not DCD, the process, at block 1028, proceeds to extract the address addresses a memory location containing the next DC. At block 1030, the process proceeds to reload the next DC from the memory as indicated by numeral 1032.

Figure 11:
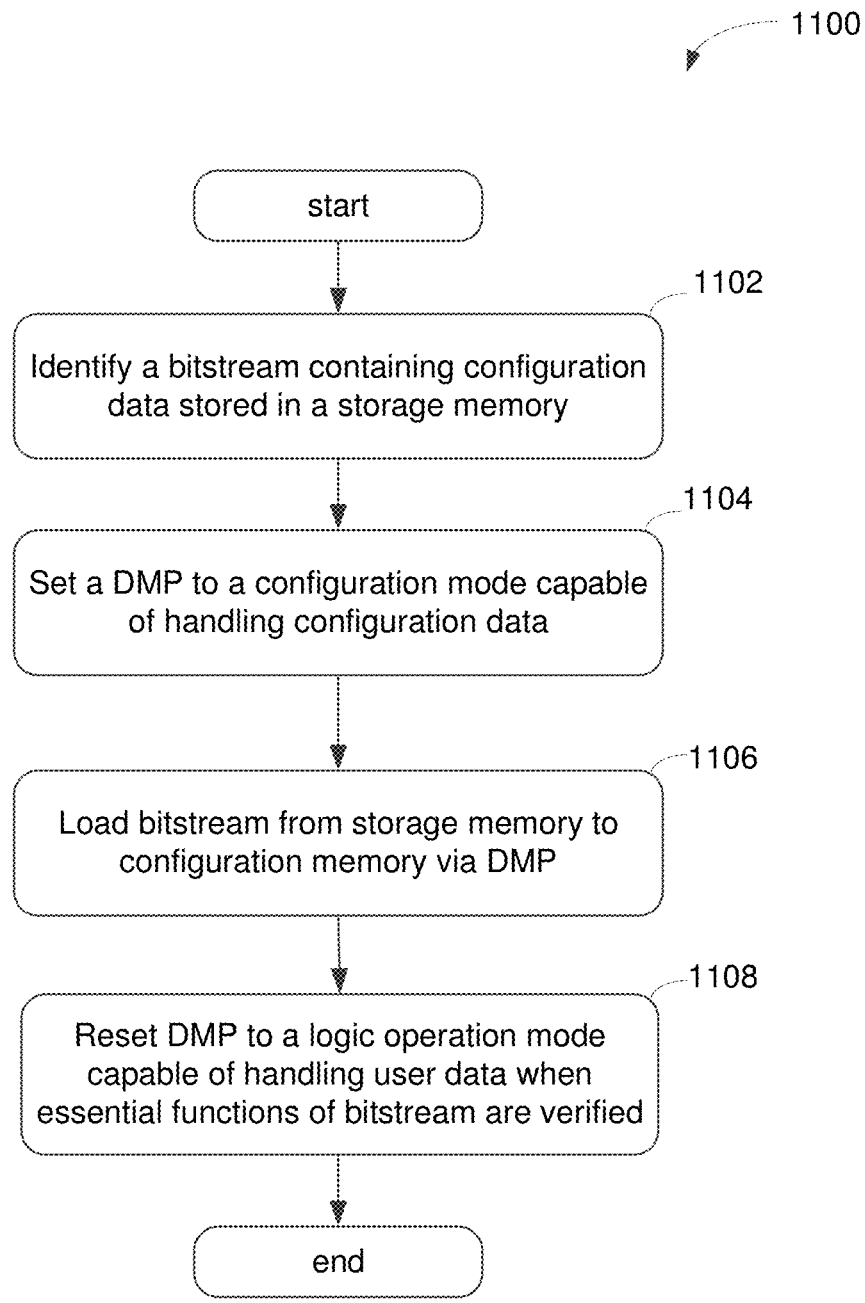
FIG. 11 is a logic flow diagram illustrating a process of configuration or data operation via a dual-mode port in accordance with one embodiment of the present invention.

FIG. 11 is a logic flow diagram 1100 illustrating a process of configuration or data processing via a dual-mode port in accordance with one embodiment of the present invention. At block 1102, a process capable of configuring FPGA via CD or loaded configuration information identifies a first bitstream containing configuration data representing user-defined logic functions stored in a first storage memory via a communication channel. The first bitstream is a primary configuration data generated and provided by a user.

At block 1104, upon identifying the first bitstream, the DMP which is coupled to the bus or the communication channel, is set (or switched) to the configuration mode. The configuration mode is a setup for handling a bitstream containing CD. In one embodiment, the DMP is managed by a pin controller in FPGA.

At block 1106, the process downloads or transmits the first bitstream from the first storage memory to the configuration memory in the FPGA via the DMP. In one embodiment, the first storage memory is an external storage device situated outside of FPGA. A benefit of loading CD from an external device is that it allows a user to control and/or manage the source of CD in real-time via user-configured logic in FPGA.

At block 1108, the DMP is subsequently reset to a logic operation mode capable of handling user data when the essential functions facilitated by the first bitstream are verified. Alternatively, the process is capable of keeping or maintaining current setting of the DMP as the configuration mode when the first bitstream is defective. For example, after verifying the integrity and/or functionalities of the first bitstream based on a set of predefined verification conditions, an address of a second bitstream is extracted from the first bitstream when the first bitstream is defective. In one aspect, the second bitstream is loaded via the DMP from a storage location addressed by the address of the second bitstream. The process is also capable of identifying an address of a BDP containing DCD for rebooting FPGA to a manufacturing default setting.

Alternatively, after verifying the integrity and/or functionalities of the first bitstream based on a set of predefined verification conditions, the DMP is switched to a logic operation mode capable of handling user data when the first bitstream is verified or not defective. For example, after generating a second bitstream representing a second set of configuration data by the configured LBs in a PLD or FPGA, the second bitstream is forwarded or sent to the external storage via the DMP. Depending on the applications, the first bitstream can also be updated by the configured LBs in the PLD to form a new bitstream representing an updated configuration data. The new bitstream is subsequently sent to the external storage via the DMP. In one aspect, upon generating a data stream representing user data provided by the PLD, the data stream can be sent to the external storage for storing the user data via the DMP. It should be noted that the external storage can be volatile, non-volatile, or a combination of volatile and non-volatile memory device.

In one embodiment, the process is able to facilitate a receipt of a new bitstream which represents an update to the CD by a user through a communication port of the PLD via a communication channel from the user situated remotely. After switching the DMP to a logic operation mode which is set to handle the user data, the new bitstream is written into the external storage via the DMP. In operation, a user generates a new bitstream or an updated bitstream representing the CD for FPGA. After transferring the updated bitstream to FPGA via a port coupled to a communication channel, the updated bitstream is stored into an external flash through DMP when DMP is set to the logic operation mode. It should be noted that the communication channel is connected to FPGA via at least one wire, cable, or connection to the user situated at a remote site.

While particular embodiments of the present invention have been shown and described, it will be obvious to those of ordinary skills in the art that based upon the teachings herein, changes and modifications may be made without departing from this exemplary embodiment(s) of the present invention and its broader aspects. Therefore, the appended claims are intended to encompass within their scope all such changes and modifications as are within the true spirit and scope of this exemplary embodiment(s) of the present invention.

What is claimed is:

1. A configurable semiconductor device able to process information, comprising:
   a storage configured to store at least two versions of configuration data provided by a user to perform user-defined logic functions;
   a bus coupled to the storage and configured to transmit information; and
   a programmable integrated circuit ("PIC") coupled to the bus and configured to have a dual-mode port ("DMP"), configurable logic blocks ("LB s"), routing connections, and a configuration memory for providing configuration data to facilitate user-defined logic functions, each of the configurable LBs including one or more lookup tables ("LUTs") configured to provide one or more output signals in accordance with a set of input signals and the configuration data, wherein the DMP is able to switch to a configuration mode for transmitting the configuration data between the storage and the configuration memory during a configuration operation, wherein the DMP is able to switch to a logic operation mode for transmitting data between the storage and the configurable LBs during a logic operation.

2. The device of claim 1, wherein the DMP, coupled to the bus, is configured to switch to the configuration mode when the DMP is operable to load the configuration data from the storage via the bus.

3. The device of claim 2, wherein the DMP, coupled to the bus, is configured to switch to the logic operation mode when the DMP is operable to handle user data after the PIC is configured.

4. The device of claim 1, wherein the storage includes,
a first memory section configured to store at least a first user configuration data for supplying at least a portion of the configuration data; and
a second memory second configured to store a backup default page ("BDP") containing default configuration data ("DCD") from PIC manufacture for rebooting the PIC to a manufacturing setting when the first user configuration data is defective.

5. The device of claim 4, wherein the first user configuration data includes a signal to facilitate the DMP to switch between modes for facilitating handling the configuration data and the user data.

6. The device of claim 4, wherein the DCD includes a signal to facilitate the DMP to switch between modes for handling the configuration data and the user data.

7. The device of claim 4, wherein the DCD is coded and provided by a manufacture which produces the PIC.

8. The device of claim 4, wherein the second memory is hidden from a user to prevent from accidentally overwrite content of the second memory by a user.

9. The device of claim 4, wherein the first memory is a flash memory configured to store multiple bitstreams for multiple user configuration data sets.

10. The device of claim 4, wherein the second memory is a flash memory configured to store the BDP.

11. The device of claim 1, wherein the PIC includes a verification component configured to verifying whether the configuration data is defective.

12. The device of claim 1, wherein the first user configuration data includes an address of next configuration data.

13. A system able to provide various digital processing functions and network communications comprising the device of claim 1.

14. A method of configuring a field-programmable gate array ("FPGA") via loading configuration information from a memory, the method comprising:
identifying a first bitstream containing configuration data representing user-defined logic functions stored in a first storage memory via a communication channel;
switching a dual-mode port ("DMP") to a configuration mode in response to a control signal for handling configuration data between the first storage memory and a configuration memory in the FPGA;
loading the first bitstream from the first storage memory to the configuration memory in the FPGA via the DMP; and
resetting the dual-mode port ("DMP") to a logic operation mode capable of handling user data for a logic operation when essential functions of FPGA programmed by the first bitstream are verified.

15. The method of claim 14, further comprising remaining the DMP to the configuration mode capable of transmitting configuration data when the first bitstream is defective.

16. The method of claim 14, further comprising:
verifying integrity of the first bitstream based on a set of predefined verification conditions; and
extracting an address of a second bitstream from the first bitstream when the first bitstream is defective.

17. The method of claim 16, further comprising loading a second bitstream via the DMP from a storage location addressed by the address of the second bitstream to the configuration memory.

18. The method of claim 14, further comprising identifying an address of a backup default page ("BDP") containing default configuration data ("DCD") capable of rebooting the FPGA to a manufacturing default setting.

19. A method for programming a programmable logic device ("PLD") via a bitstream of configuration information, comprising:
identifying a first bitstream containing configuration data representing user-defined logic functions stored in an external storage device coupled to the PLD via a bus;
switching a dual-mode port ("DMP") from a logic operation mode to a configuration mode in response to a control signal from a switch for handling configuration data from the external storage device to a configuration memory;
loading the first bitstream from the external storage device to the configuration memory in the PLD via the DMP; and
maintaining setting of the DMP to the configuration mode for continuing receipt of a second bitstream containing configuration data when the first bitstream is defective.

20. The method of claim 19, further comprising switching the DMP to a logic operation mode capable of handling user data when the first bitstream is verified.

21. The method of claim 20, further comprising:
generating a second bitstream representing a second set of configuration data by a plurality of configured logic blocks ("LBs") in the PLD; and
forwarding the second bitstream to the external storage via the DMP.

22. The method of claim 20, further comprising:
updating the first bitstream by a plurality of configured logic blocks ("LBs") in the PLD to form a new bitstream representing an updated configuration data; and
forwarding the new bitstream to the external storage via the DMP.

23. The method of claim 20, further comprising:
generating a data stream representing user data updating by a plurality of configured logic blocks ("LBs") in the PLD; and
sending the data stream to the external storage for storing the user data via the DMP.

24. The method of claim 19, further comprising:
receiving a new bitstream representing an update to the configuration data by a communication port via a communication channel from a user situated remotely; and
storing the new bit stream into the configuration memory in the PLD.

25. The method of claim 24, further comprising:
switching the DMP to a logic operation mode capable of handling user data; and
writing the new bitstream into the external storage via the DMP.

* * * * *